(12) United States Patent
Lu et al.

(10) Patent No.: US 12,048,164 B2
(45) Date of Patent: Jul. 23, 2024

(54) MEMORY ARRAY AND OPERATION METHOD THEREOF

(71) Applicant: Taiwan Semiconductor Manufacturing Company, Ltd., Hsinchu (TW)

(72) Inventors: Wen-Ling Lu, Taoyuan (TW); Chen-Jun Wu, Hsinchu (TW); Ya-Yun Cheng, Taichung (TW); Sheng-Chih Lai, Hsinchu County (TW); Yi-Ching Liu, Hsinchu (TW); Yu-Ming Lin, Hsinchu (TW); Feng-Cheng Yang, Hsinchu County (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 17 days.

(21) Appl. No.: 18/151,483

(22) Filed: Jan. 9, 2023

(65) Prior Publication Data
US 2024/0090230 A1  Mar. 14, 2024

Related U.S. Application Data

(60) Provisional application No. 63/405,894, filed on Sep. 13, 2022.

(51) Int. Cl.
*H10B 51/30* (2023.01)
*G11C 11/22* (2006.01)
*H10B 51/20* (2023.01)

(52) U.S. Cl.
CPC ............ *H10B 51/30* (2023.02); *G11C 11/223* (2013.01); *G11C 11/2275* (2013.01); *H10B 51/20* (2023.02)

(58) Field of Classification Search
CPC ...... H10B 51/30; H10B 51/20; G11C 11/223; G11C 11/2275
USPC .......................................................... 365/145
See application file for complete search history.

(56) References Cited

U.S. PATENT DOCUMENTS

| | | | |
|---|---|---|---|
| 2023/0153592 A1* | 5/2023 | Nam | H01L 29/40111 706/33 |
| 2023/0282275 A1* | 9/2023 | Lee | H01L 29/513 |
| 2023/0397432 A1* | 12/2023 | Heo | H10B 53/20 |

FOREIGN PATENT DOCUMENTS

TW        201222827 A  *  6/2012  ........... G11C 11/223

* cited by examiner

*Primary Examiner* — Fernando Hidalgo
(74) *Attorney, Agent, or Firm* — JCIPRNET

(57) ABSTRACT

A memory array and an operation method of the memory array are provided. The memory array includes first and second ferroelectric memory devices formed along a gate electrode, a channel layer and a ferroelectric layer between the gate electrode and the channel layer. The ferroelectric memory devices include: a common source/drain electrode and two respective source/drain electrodes, separately in contact with a side of the channel layer opposite to the ferroelectric layer, wherein the common source/drain electrode is disposed between the respective source/drain electrodes; and first and second auxiliary gates, capacitively coupled to the channel layer, wherein the first auxiliary gate is located between the common source/drain electrode and one of the respective source/drain electrodes, and the second auxiliary gate is located between the common source/drain electrode and the other respective source/drain electrode.

20 Claims, 19 Drawing Sheets

MEMORY ARRAY AND OPERATION METHOD THEREOF

CROSS-REFERENCE TO RELATED APPLICATION

This application claims the priority benefits of U.S. provisional application Ser. No. 63/405,894, filed on Sep. 13, 2022. The entirety of each of the above-mentioned patent applications is hereby incorporated by reference herein.

BACKGROUND

In recent development of nonvolatile memories, ferroelectric material is utilized as a storage medium. Information can be stored as a certain polarization state in the ferroelectric material, and such polarization state can be maintained even in absence of a voltage applied across the ferroelectric material. Due to non-volatility and superior data process speed, ferroelectric memory device has attracted considerable attention as a next generation memory device. However, further improvements for the ferroelectric memory device in many aspects are still required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
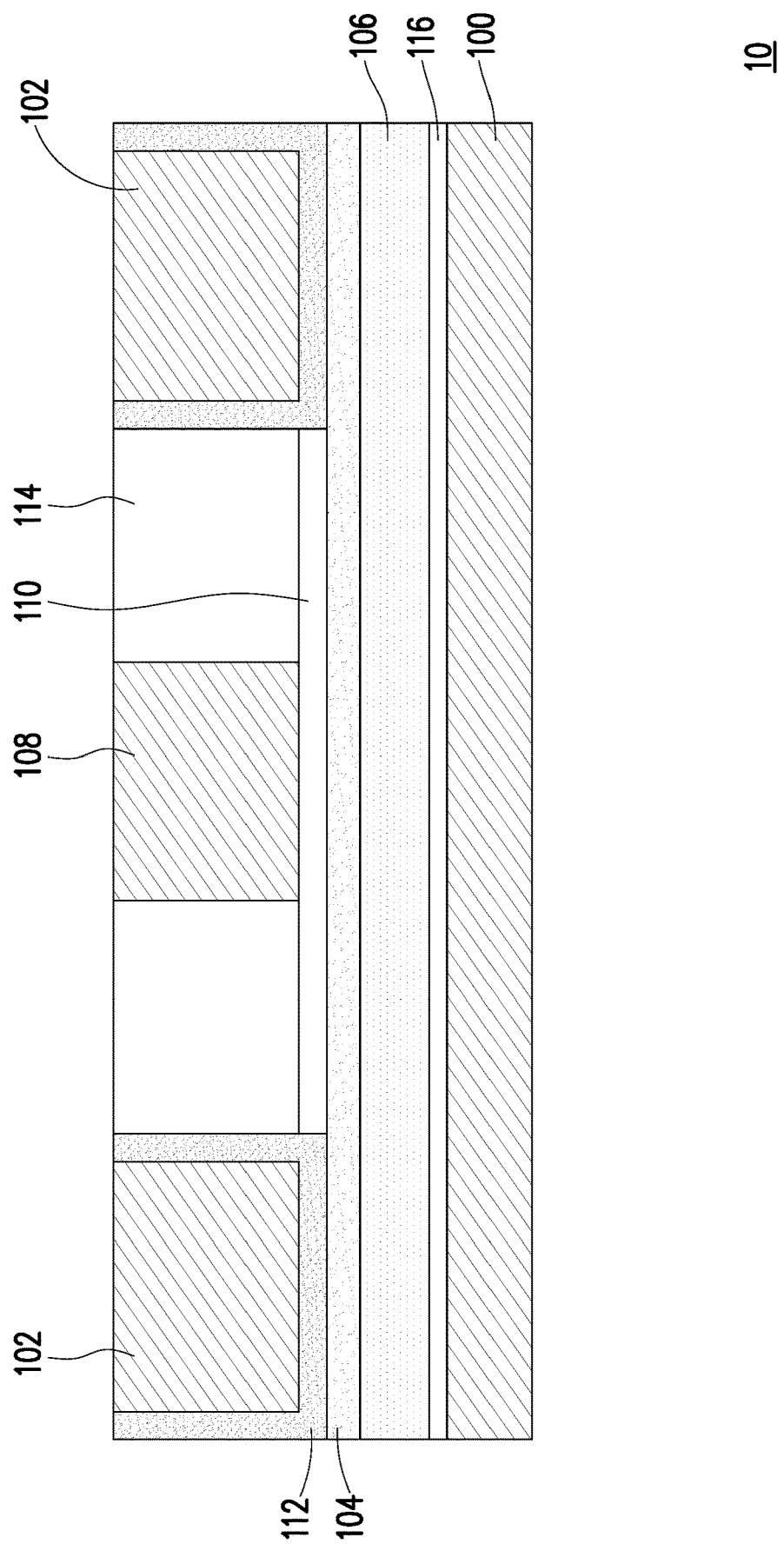
FIG. 1A is a schematic plan view illustrating a ferroelectric memory device, according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a schematic plan view illustrating a ferroelectric memory device 10, according to some embodiments of the present disclosure.

Referring to FIG. 1A, the ferroelectric memory device 10 is a ferroelectric field effect transistor (ferroelectric FET). A gate electrode 100 is provided as a gate terminal of the ferroelectric memory device 10, and a pair of source/drain electrodes 102 are provided as source and drain terminals of the ferroelectric memory device 10. Interchangeably, while one of the source/drain electrodes 102 is function as the source terminal, the other of the source/drain electrodes 102 is functioned as the drain terminal. As a switching layer, a channel layer 104 extends between the source/drain electrodes 102 and the gate electrode 100. In addition, as a data storage layer, a ferroelectric layer 106 lies in between the gate electrode 100 and the channel layer 104, such that the gate electrode 100 can be capacitively coupled to the channel layer 104 through the ferroelectric layer 106.

Further, an auxiliary gate 108 is located between the source/drain electrodes 102 at a side of the channel layer 104 facing away from the gate electrode 100, and is configured to enhance control of the gate electrode 100 over charge carriers in the channel layer 104. A dielectric layer 110 separates the auxiliary gate 108 from the channel layer 104, such that the auxiliary gate 108 can be capacitively coupled to the channel layer 104 through the dielectric layer 110.

In some embodiments, the source/drain electrodes 102 are each in contact with the channel layer 104 through a contact enhancement layer 112. The contact enhancement layers 112 and the channel layer 104 may be formed of the same semiconductor material, except that the contact enhancement layers 112 may be formed with a higher doping concentration, so as to possess a resistivity lower than a resistivity of the channel layer 104. Therefore, a contact resistance between the source/drain electrodes 102 and the channel layer 104 can be lowered by further disposing the contact enhancement layers 112. In certain embodiments, each of the contact enhancement layers 112 wraps around the corresponding source/drain electrode 102. Although not shown in FIG. 1A, the source/drain electrodes 102 may be completely enclosed by the contact enhancement layers 112, respectively. Further, the source/drain electrodes 102 may be in contact with the dielectric layer 110 extending between the auxiliary gate 108 and the channel layer 104 through the contact enhancement layers 112. Moreover, in some embodiments, the source/drain electrodes 102 and the contact enhancement layers 112 may be separated from the auxiliary gate 108 by a dielectric material 114.

In some embodiments, the gate electrode 100 is in contact with the ferroelectric layer 106 through an adhesive layer 116. An adhesion between the gate electrode 100 and the ferroelectric layer 106 may be improved by disposing the adhesive layer 116. As examples, titanium nitride, tantalum nitride, the like or combinations thereof may be used for forming the adhesive layer 116.

Whether a conduction channel electrically connecting one of the source/drain electrodes 102 to the other could be established is controlled by a switching voltage applied across the channel layer 104 and the ferroelectric layer 106. When the switching voltage reaches a threshold value (also referred to as a threshold voltage of the ferroelectric memory device 10), the conduction channel can be established. On the other hand, when the switching voltage does not reach the threshold value or falls below the threshold value, the conduction channel cannot be established.

The threshold voltage of the ferroelectric memory device 10 is alterable, and is dependent on a polarization state of the ferroelectric layer 106. If an electric field created across the ferroelectric layer 106 as a result of a first polarization state of the ferroelectric layer 106 is in a direction aligned with a polarity of the switching voltage, a smaller threshold voltage may be obtained. In contrast, if an electric field across the ferroelectric layer 106 induced by a second polarization state of the ferroelectric layer 106 is in a direction opposite to the polarity of the switching voltage, then a higher threshold voltage may be resulted. During a write operation of the ferroelectric memory device 10, the ferroelectric layer 106 can be written with either the first polarization state resulting the smaller threshold voltage or the second polarization state resulting the greater threshold voltage. During a read operation, the switching voltage is provided with an amplitude greater than the rather small threshold voltage and less than the rather large threshold voltage. If the ferroelectric layer 106 is written with the first polarization state (which results in a rather small threshold voltage), then a current path can be established through the channel layer 104 by this switching voltage. On the other hand, if the ferroelectric layer 106 is written with the second polarization state (which results in a rather large threshold voltage), then a current path may not be established through the channel layer 104 by this switching voltage. By sensing a resistivity of the channel layer 104 in response to this switching voltage, whether a current can be established through the channel layer 104 can be identified. Therefore, whether the ferroelectric layer 106 is in the first polarization state or the second polarization state can be recognized. Accordingly, binary data can be stored in the ferroelectric memory device 10 as the first polarization state or the second polarization state of the ferroelectric layer 106, and a difference between the rather small threshold voltage (resulting from the first polarization state) and the rather large threshold voltage (resulting from the second polarization state) is referred to as a memory window of the ferroelectric memory device 10.

In order to write the first or second polarization state to the ferroelectric layer 106, a strong and uniform electric field must be set across the ferroelectric layer 106. The electric field may be set with a first direction while writing the first polarization state to the ferroelectric layer 106, and with a second direction opposite to the first direction while writing the second polarization state to the ferroelectric layer 106.

Figure 1B:
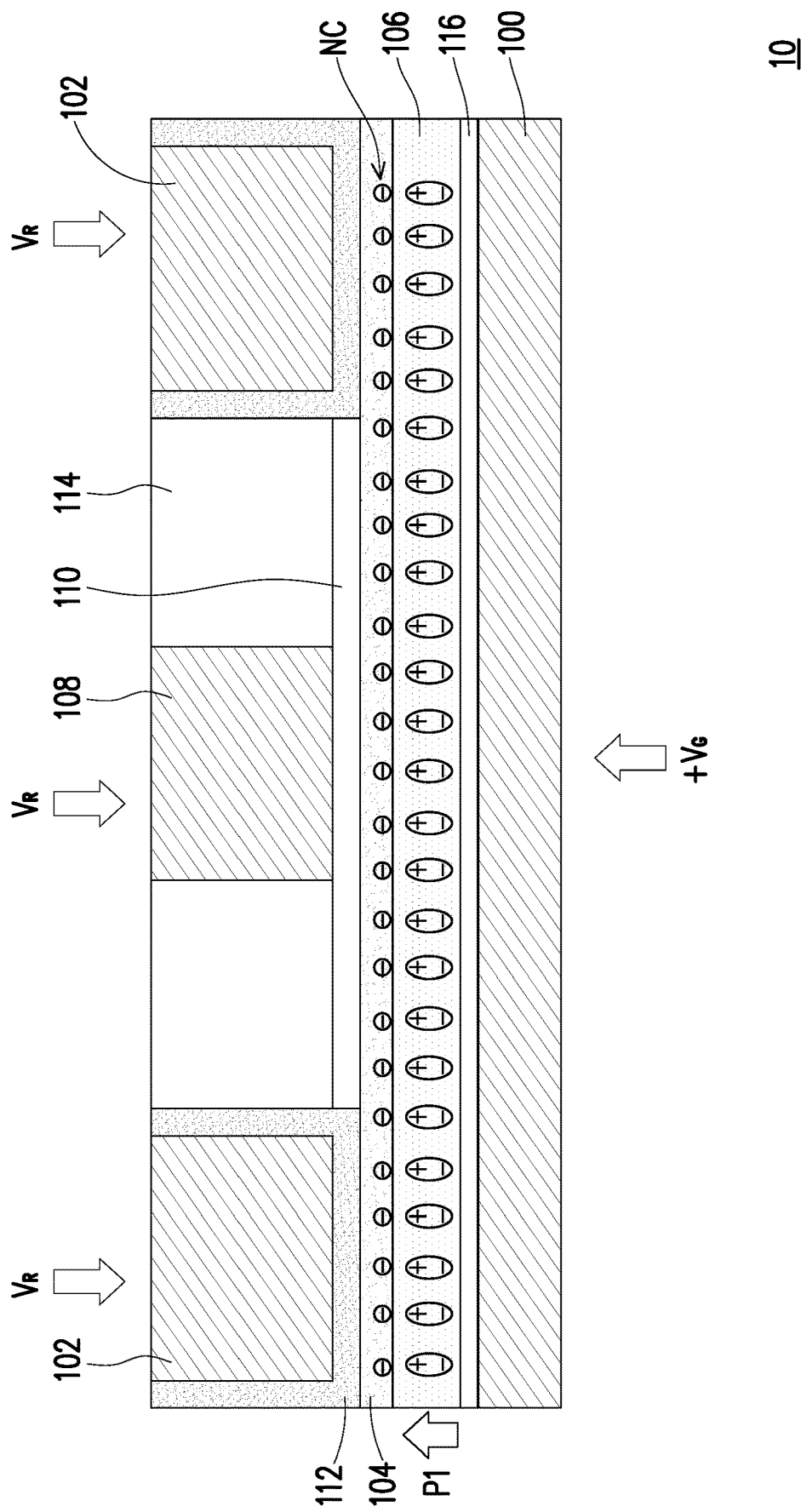
FIG. 1B shows a scheme for writing a first polarization state to a ferroelectric layer of the ferroelectric memory device, according to some embodiments of the present disclosure.

FIG. 1B shows a scheme for writing a first polarization state P1 to the ferroelectric layer 106 of the ferroelectric memory device 10, according to some embodiments of the present disclosure.

In these embodiments, the channel layer 104 is provided as an N-type semiconductor material with negative charge carriers NC (i.e., mobile electrons). As examples, the N-type semiconductor material may include indium gallium zinc oxide (IGZO), zinc oxide, indium oxide, tin oxide, the like or combinations thereof. During this write operation (also referred to as a programming operation), a positive gate voltage $+V_G$ may be provided to the gate electrode 100. Meanwhile, in some embodiments, the source/drain electrodes 102 receive a reference voltage $V_R$ (e.g., a ground voltage). Further, the auxiliary gate 108 may also receive the reference voltage $V_R$ as well. As a result of an electrical potential difference between opposite sides of the ferroelectric layer 106, the negative charge carriers NC in the channel layer 104 are accumulated along an interface between the ferroelectric layer 106 and the channel layer 104. Consequently, an electric field pointing toward the channel layer 104 is set across the ferroelectric layer 106, and electric dipoles in the ferroelectric layer 106 are reoriented toward a direction opposite to the direction of the electric field, such that the ferroelectric layer 106 is written with the first polarization state P1. Even though some portions of the ferroelectric layer 106 not overlapped with the auxiliary gate 108 nor the source/drain electrodes 102 may be subjected to a smaller voltage bias, a sufficient electric field can still be established across these portions of the ferroelectric layer 106 because of the accumulation of the negative charge carriers NC in response to the positive gate voltage $+V_G$, thus these portions of the ferroelectric layer 106 can still be polarized.

Figure 1C:
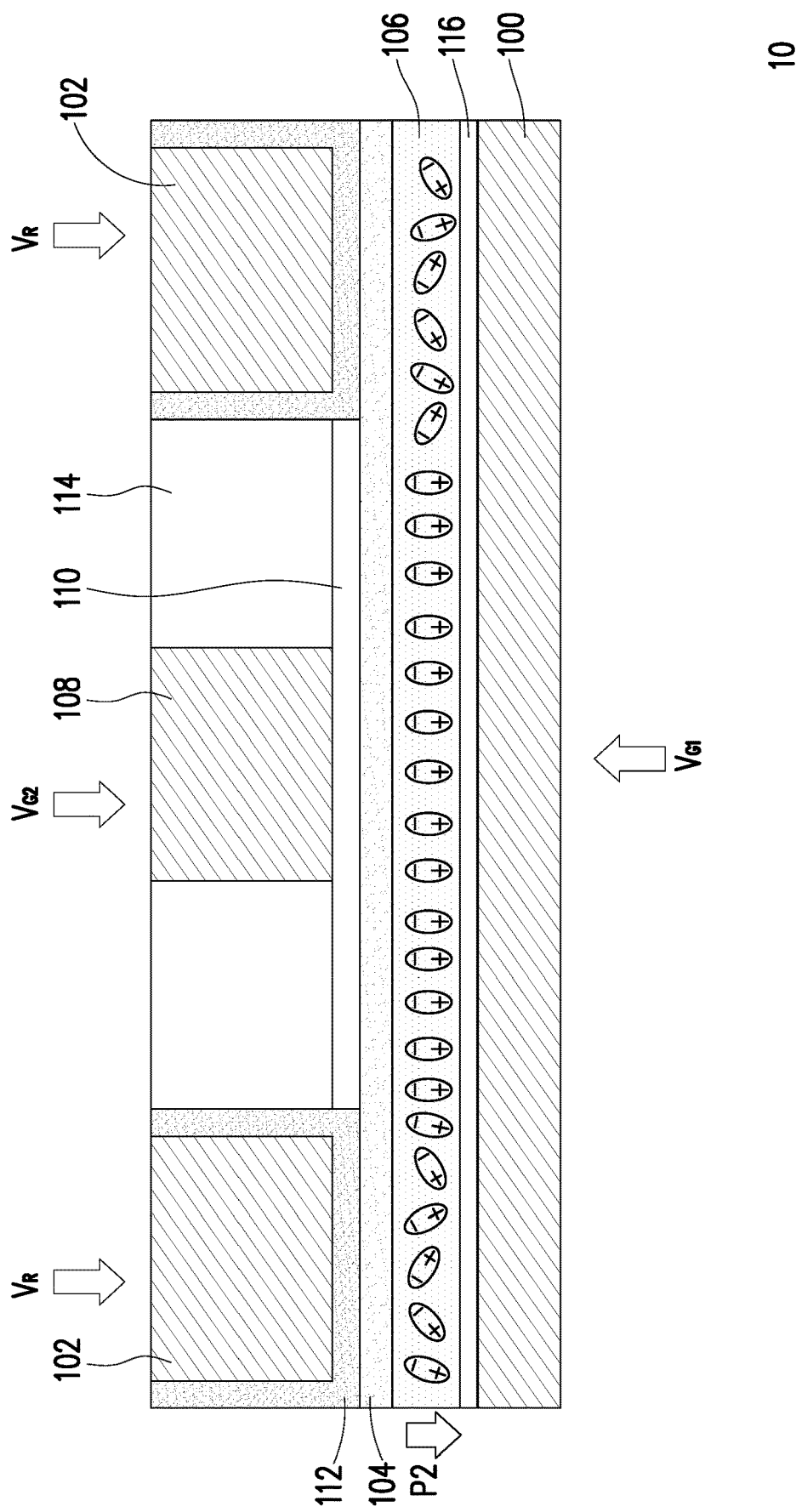
FIG. 1C shows a scheme for writing a second polarization state to the ferroelectric layer of the ferroelectric memory device, according to some embodiments of the present disclosure.

FIG. 1C shows a scheme for writing a second polarization state P2 to the ferroelectric layer 106 of the ferroelectric memory device 10, according to some embodiments of the present disclosure.

During this write operation (also referred to as an erase operation), a gate voltage $V_{G1}$ may be provided to the gate electrode 100, and the auxiliary gate 108 may receive a gate voltage $V_{G2}$, such that a strong electric field with a direction pointing toward the gate electrode 100 can be created across a portion of the ferroelectric layer 106 lying between the gate electrode 100 and the auxiliary gate 108, as a result of a difference between the gate voltages $V_{G1}$, $V_{G2}$. Consequently, this portion of the ferroelectric layer 106 can be polarized with the second polarization state P2. In those embodiments where the channel layer 104 is formed of an N-type semiconductor material, the gate voltages $V_{G1}$, $V_{G2}$ may be positive voltages, and the gate voltage $V_{G2}$ may be greater in amplitude as compared to the gate voltage $V_{G1}$. Alternatively, the gate voltage $V_{G1}$ may be provided as a negative voltage, while the gate voltage $V_{G2}$ may be provided as a positive voltage. In addition, during this write operation (i.e., the erase operation), the source/drain electrodes 102 may receive the reference voltage $V_R$. A voltage difference between the gate voltages $V_{G1}$ and the reference voltage $V_R$ is smaller than a voltage difference between the gate voltages $V_{G1}$, $V_{G2}$. As the channel layer 104 is provided as an N-type semiconductor material, the channel layer 104 may not have positive charge carriers (i.e., holes) to be accumulated along the interface between the channel layer 104 and the ferroelectric layer 106 in response to the voltage difference across the ferroelectric layer 106. Therefore, a strong electric field may not be established across some portions of the ferroelectric layer 106 subjected to a smaller voltage bias (e.g., portions of the ferroelectric layer 106 lying between the gate electrode 100 and the source/drain electrodes 102). Thus, these portions of the ferroelectric layer 106 may not be polarized with the second polarization state P2. In other words, the ferroelectric layer 106 may be partially polarized.

By disposing the auxiliary gate 108, the ferroelectric layer 106 can be polarized with the second polarization state P2, without increasing voltage difference between the gate electrode 100 and the source/drain electrodes 102. As the ferroelectric layer 106 can be switched between the first and second polarization states P1, P2, a sufficient difference between the rather small threshold voltage (resulting from the first polarization state P1) and the rather large threshold voltage (resulting from the second polarization state P2) can be obtained. In other words, the ferroelectric memory device 10 can be operated with a sufficient memory window. Further, when one of the source/drain electrodes 102 is shared with another ferroelectric memory device 10, keeping the voltage difference between the gate electrode 100 and the source/drain electrodes 102 low in a selected one of the ferroelectric memory devices 10 may prevent from accidentally subjecting the other ferroelectric memory device 10 to the erase operation.

Although not shown, in alternative embodiments where the channel layer 104 is formed of a P-type semiconductor material having positive charge carriers (i.e., holes), a similar effect of ensuring memory window of the ferroelectric memory device 10 can be obtained by disposing the auxiliary gate 108. As examples, the P-type semiconductor material may include nickel oxide, copper oxide ($Cu_2O$), copper aluminum oxide ($CuAlO_2$), copper gallium oxide ($CuGaO_2$), copper indium oxide ($CuInO_2$), strontium copper oxide ($SrCu_2O_2$), tin oxide, the like or combinations thereof.

In addition to ensure memory window, the auxiliary gate 108 can be configured to adjust a read voltage provided to the gate electrode 100 during a read operation. In those embodiments where the channel layer 104 is formed of an N-type semiconductor material, accumulation of the negative charge carriers NC in the channel layer 104 can be enhanced by providing a positive voltage to the auxiliary gate 108, thus a smaller value of the read voltage would be required for a read operation. On the other hand, the negative charge carriers NC in the channel layer 104 can be depleted by providing a negative voltage to the auxiliary gate 108, and the read voltage with a greater value would be required for a read operation. Further, the read voltage can be tuned by adjusting amplitude of the voltage provided to the auxiliary gate 108. Similarly, in alternative embodiments where the channel layer 104 is formed of a P-type semiconductor material, the read voltage can be tuned by using the auxiliary gate 108.

Figure 2:
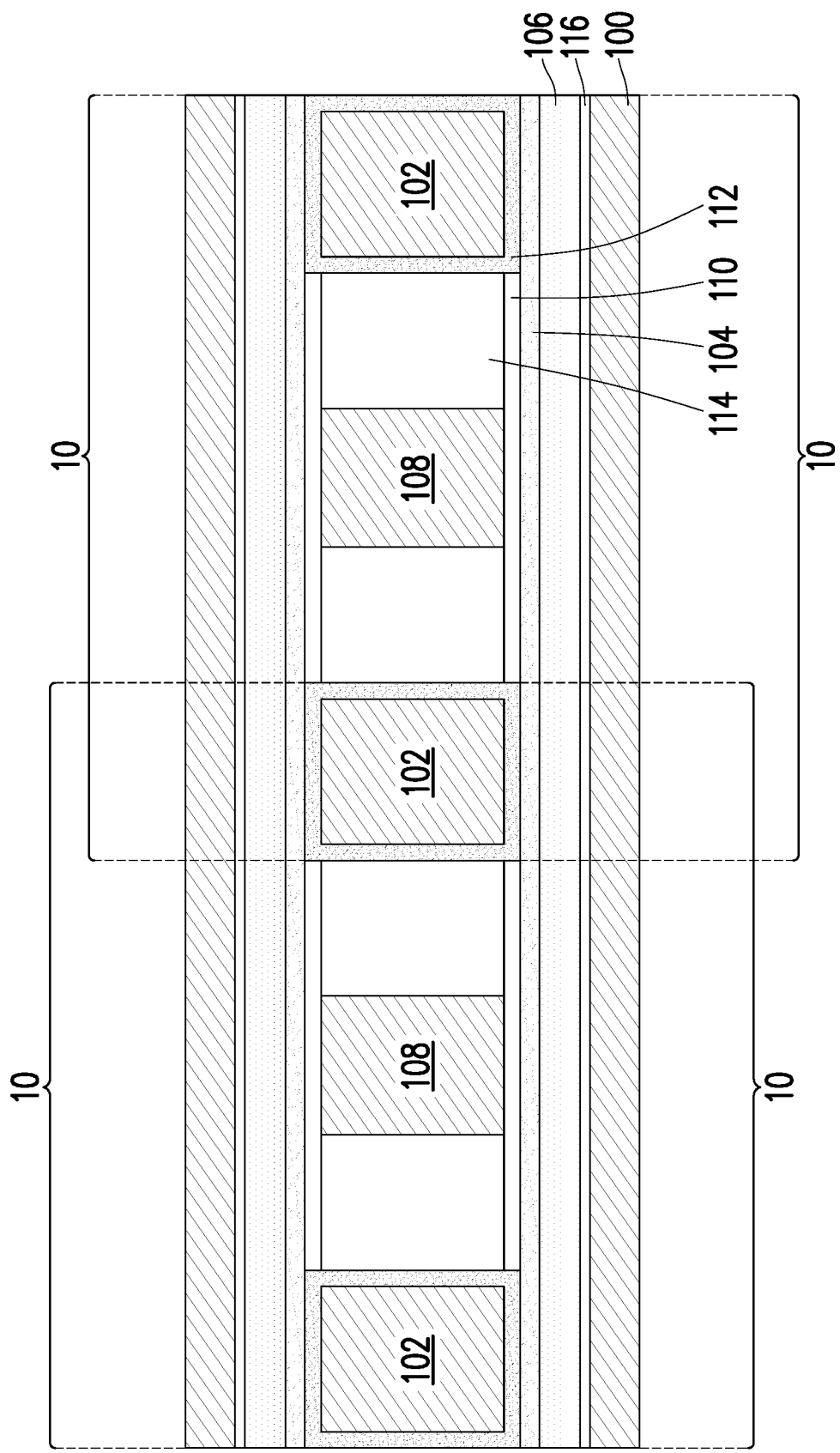
FIG. 2 is a schematic plan view illustrating a plurality of the ferroelectric memory devices arranged along two columns, according to some embodiments of the present disclosure.

FIG. 2 is a schematic plan view illustrating a plurality of the ferroelectric memory devices 10 arranged along two columns, according to some embodiments of the present disclosure.

Referring to FIG. 2, a plurality of the gate electrodes 100 extend along a column direction. The ferroelectric memory devices 10 in each column share the same gate electrode 100. A plurality of the ferroelectric layers 106 extend along sidewalls of the gate electrodes 100, and may be each in lateral contact with the gate electrodes 100 through one of a plurality of the adhesive layers 116. In addition, a plurality of the channel layers 104 are in lateral contact with the gate electrodes 100 through the ferroelectric layers 106. Further, pairs of the source/drain electrodes 102 and a plurality of the auxiliary gates 108 are located between the gate electrodes 100, and are in lateral contact with the channel layers 104. Each pair of the source/drain electrodes 102 and the auxiliary gate 108 in between are in lateral contact with one of the channel layers 104 by one side, and are in lateral contact with another one of the channel layers 104 by the other side. A plurality of the dielectric layers 110 each separate one of the auxiliary gates 108 from one of the channel layers 104. In some embodiments, the source/drain electrodes 102 are wrapped around by a plurality of the contact enhancement layers 112, respectively. Moreover, in some embodiments, the dielectric material 114 fills up the space between the source/drain electrodes 102 and the auxiliary gates 108, and is in contact with the dielectric layers 110.

In a common source line architecture, the ferroelectric memory devices 10 in each column may be arranged in pairs. Multiple ones of the channel layers 104 (only a single one is shown) are separately disposed along each gate electrode 100, and are respectively shared by the ferroelectric memory devices 10 in one pair. Further, the ferroelectric memory devices 10 in each pair may share a common source/drain electrode 102, while each having an independently operated source/drain electrode 102 and a respective auxiliary gate 108. In other words, each pair of the ferroelectric memory devices 10 may have three of the source/drain electrodes 102 and two of the auxiliary gates 108. Since the ferroelectric memory devices 10 in each pair share a common source/drain electrode 102, smaller footprint area may be required for each pair of the ferroelectric memory devices 10. Accordingly, an array of the ferroelectric memory devices 10 can be arranged within a more compact area.

During a programming operation as described with reference to FIG. 1B, a column of the ferroelectric memory devices 10 sharing the same gate electrode 100 and the same ferroelectric layer 106 may be all written with the first polarization state P1. In an erase operation (as described with reference to FIG. 1C) following the programming operation, selected ones of the ferroelectric memory device (s) 10 in the column may be overwritten with the second polarization state P2. During the erase operation, the shared gate electrode 100 and the auxiliary gate(s) 108 of the selected ferroelectric memory device(s) 10 are operated for overwriting overlapped portions of the shared ferroelectric layer 106, while a voltage difference between the source/drain electrodes 102 of the selected ferroelectric memory device(s) 10 and the shared gate electrode 100 can be kept in a low value for preventing from accidentally overwriting other portions of the shared ferroelectric layer 106. That is, unselected one(s) of the ferroelectric memory devices 10 can be avoided from being overwritten, and a data pattern can be correctly allocated to an array of the ferroelectric memory devices 10.

Figure 3:
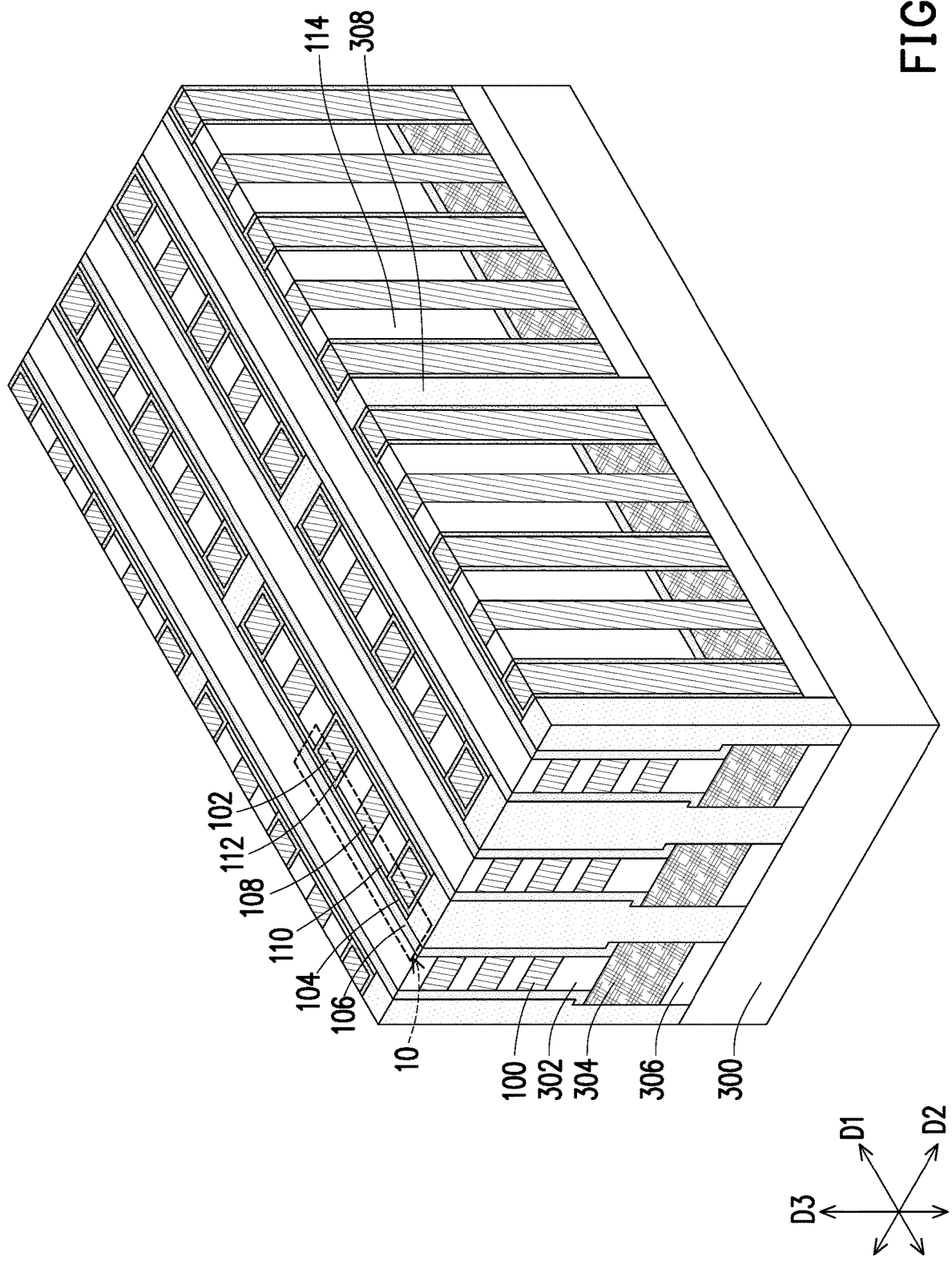
FIG. 3 is a three-dimensional view illustrating a memory array including stacks of the ferroelectric memory devices, according to some embodiments of the present disclosure.

FIG. 3 is a three-dimensional view illustrating a memory array 30 including stacks of the ferroelectric memory devices 10, according to some embodiments of the present disclosure.

Referring to FIG. 3, the memory array 30 is built on a base structure 300. Although not shown, the base structure 300 may include active devices (e.g., transistors) formed on a semiconductor wafer, and include a stack of dielectric layer covering the active devices and the semiconductor wafer. Further, conductive features may spread in the stack of dielectric layers for interconnecting the active devices, and for routing the memory array 30. As an example, these conductive features may include global signal lines of the memory array 30.

Stacks of the gate electrodes 100 extend along a column direction D1 over the base structure 300, and are arranged along a row direction D2. The gate electrodes 100 in each stack are alternately arranged with insulating layers 302 along a height direction D3. Further, the stacks of the gate electrodes 100 and the insulating layers 302 may be separated from the base structure 300 via an etching stop layer 304 and a bottom insulating layer 306 lying below the etching stop layer 304.

The ferroelectric layers 106 are formed along sidewalls of the stacks of the gate electrodes 100 and the insulating layers 302, and may or may not cover portions of the etching stop layer 304 between the stacks of the gate electrodes 100 and the insulating layers 302. Although not shown in FIG. 3, the ferroelectric layers 106 may be in lateral contact with the gate electrodes 100 and the insulating layers 302 through the adhesive layers 116 as described with reference to FIG. 1A and FIG. 2. Further, each of the ferroelectric layers 106 is in lateral contact with separate ones of the channel layers 104, so as to be sandwiched between multiple ones of the channel layers 104 and the gate electrodes 100 and the insulating layers 302 in one of the stacks. The source/drain electrodes 102 and the auxiliary gates 108 are formed as conductive pillars standing between the stacks of the gate electrodes 100 and the insulating layers 302, and are in lateral contact with the channel layers 104. According to some embodiments, the source/drain electrodes 102 and the auxiliary gates 108 may penetrate through the etching stop layers 304, to reach the bottom insulating layers 306. The dielectric layers 110 may each extend between one of the auxiliary gates 108 and one of the channel layers 104. In addition, each source/drain electrode 102 may be wrapped around by one of the contact enhancement layers 112. Based on a common source line architecture, stacks of the ferroelectric memory devices 10 are arranged in pairs along the column direction D1. As a repetitive unit, three of the source/drain electrodes 102 and two of the auxiliary gates 108 in between are arranged between two of the channel layers 104, and are shared by two stacks of the ferroelectric memory devices 10.

The dielectric material 114 may be formed between the stacks of the gate electrodes 100 and the insulating layers 302, and fills up the space between each auxiliary gate 108 and the source/drain electrodes 102 at opposite sides. Further, insulating pillars 308 may each stand between adjacent ones of the source/drain electrodes 102 from neighbor repetitive units, and separate the channel layers 104 from one another. According to some embodiments, the insulating pillars 308 penetrate through the etching stop layers 304 and the bottom insulating layers 306, whereas the dielectric material 114 is bounded at a top surface of the etching stop layer 304.

The ferroelectric memory devices 10 at the same height and arranged in the same column may share the same gate electrode 100, while being operated via different pairs of the source/drain electrodes 102 as well as different ones of the auxiliary gates 108. On the other hand, the ferroelectric memory devices 10 at the same side of each stack may share the same pair of the source/drain electrodes 102 and the same auxiliary gate 108, while being operated by different ones of the gate electrodes 100.

As described above, the common source line architecture allows laterally adjacent ones of the ferroelectric memory devices 10 to share a common source/drain electrode 102 and thus can be formed within a more compact area. In addition, the auxiliary gates 108 in the ferroelectric memory devices 10 can be operated to prevent interference between the ferroelectric memory devices 10 sharing a common source/drain electrode 10 and the same gate electrode 100. Furthermore, by staking the ferroelectric memory devices 10, an array of the ferroelectric memory devices 10 will no longer be limited to two-dimensional design, and storage density of the array can be significantly increased.

Figure 4:
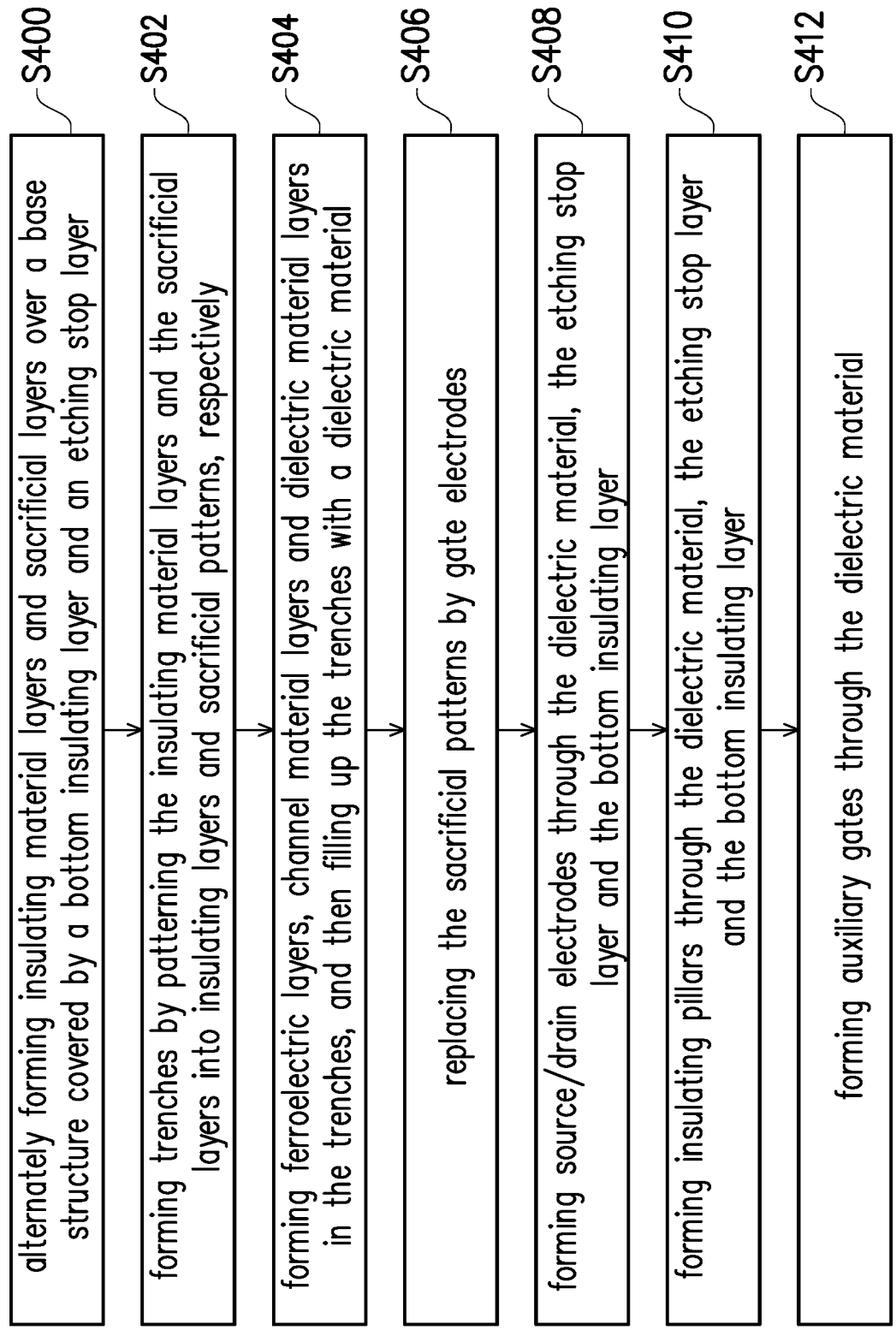
FIG. 4 is a flow diagram illustrating a process for forming the memory array, according to some embodiments of the present disclosure.

FIG. 4 is a flow diagram illustrating a process for forming the memory array 30, according to some embodiments of the present disclosure. FIG. 5A through FIG. 5F are schematic three-dimensional views illustrating intermediate structures at various stages during the process as shown in FIG. 4.

Figure 5A:
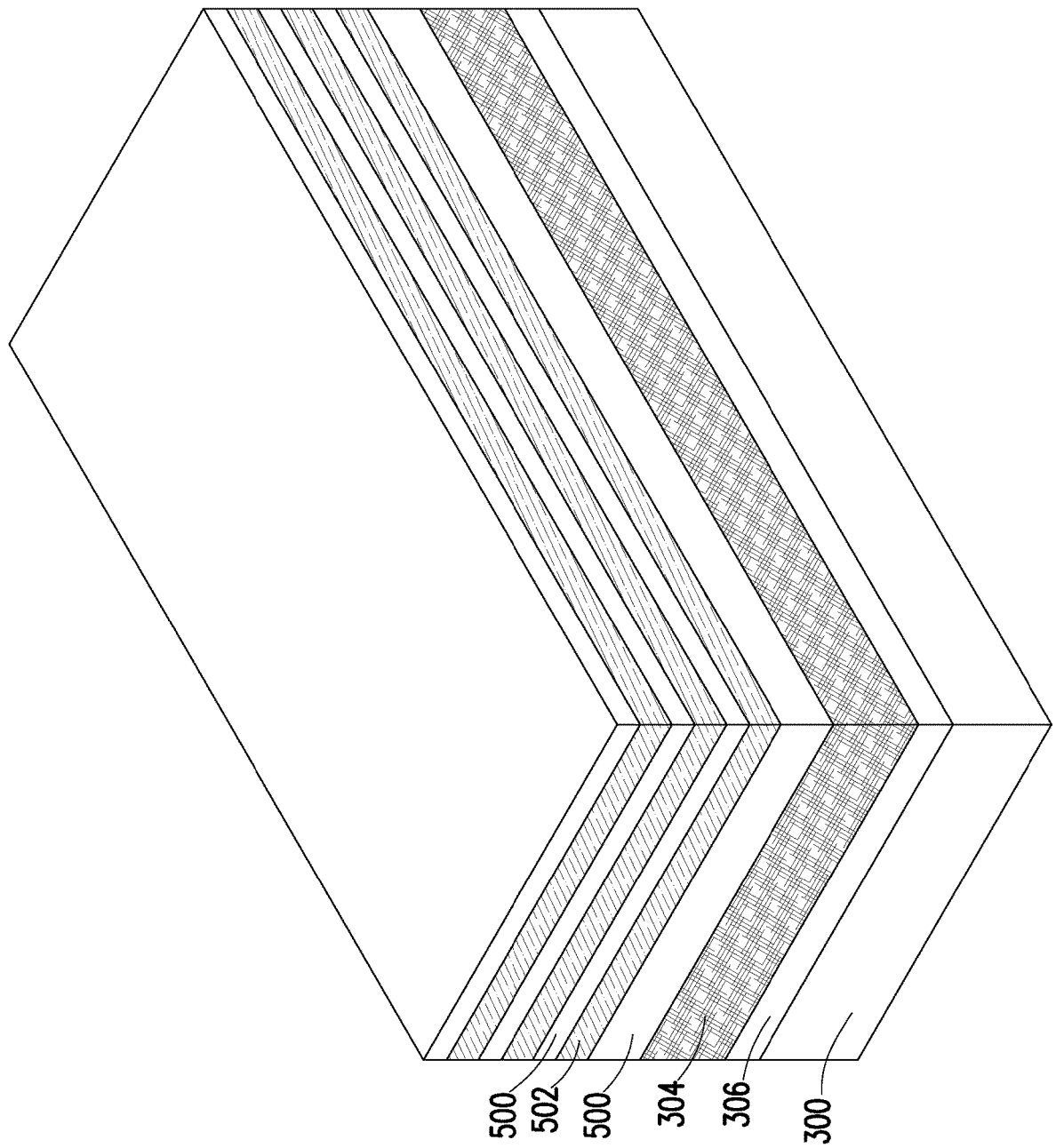
FIG. 5A through FIG. 5F are schematic three-dimensional views illustrating intermediate structures at various stages during the process as shown in FIG. 4.

Referring to FIG. 4 and FIG. 5A, at a step S400, insulating material layers 500 and sacrificial layers 502 are alternately stacked over the base structure 300 covered with the bottom insulating layer 306 and the etching stop layer 304. A front-end-of-line (FEOL), a middle-end-of-line (MEOL) and a portion of a back-end-of-line (BEOL) process may be performed on a semiconductor wafer for preparing the base structure 300. The insulating material layers 500 will be patterned to form the insulating layers 302 as shown in FIG. 3, whereas the sacrificial layers 502 will be patterned and then replaced by the gate electrodes 100 as shown in FIG. 3.

Figure 5B:
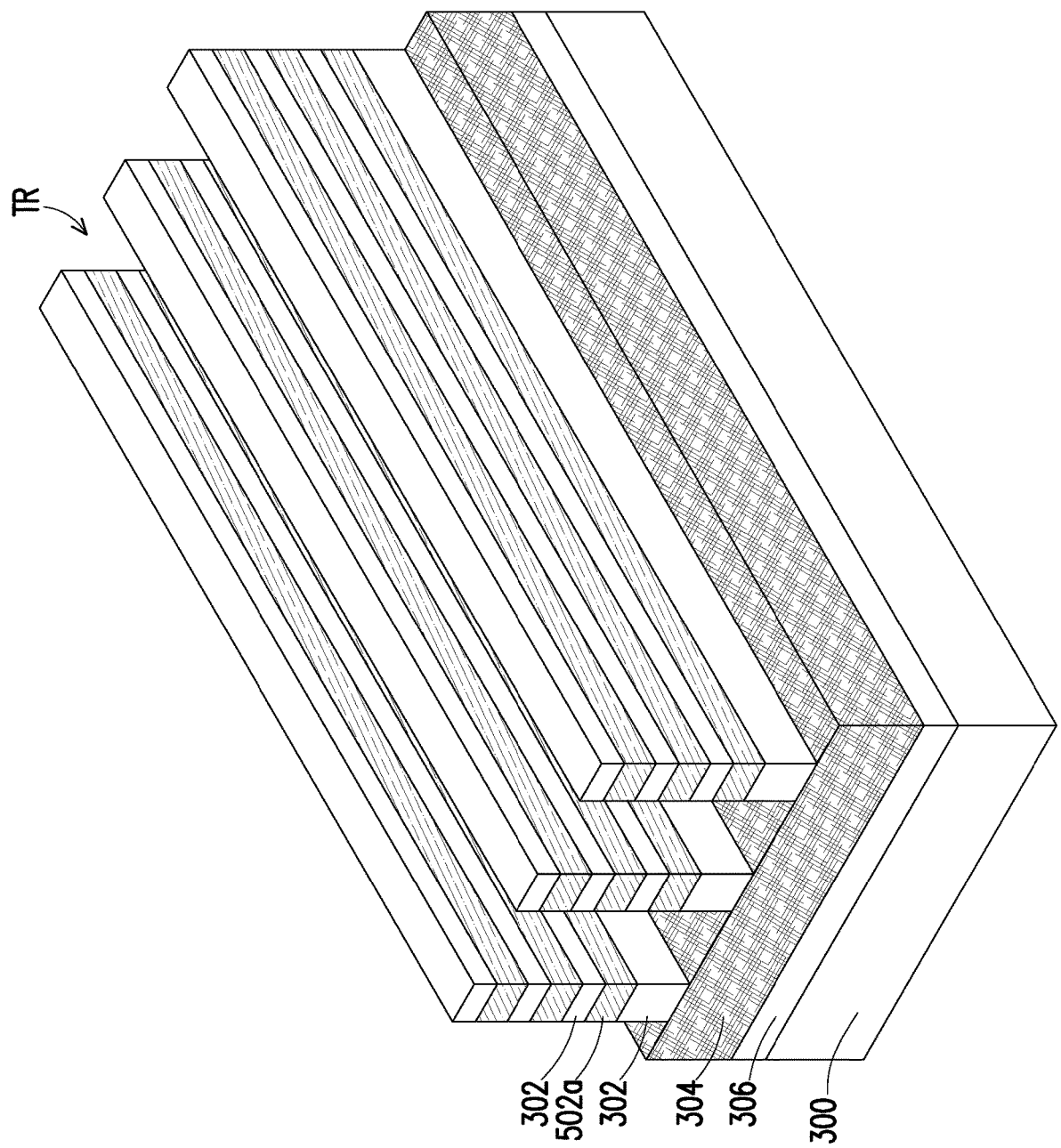

Referring to FIG. 4 and FIG. 5B, at a step S402, trenches TR are formed through the stack of the insulating material layers 500 and the sacrificial layers 502. As a result of forming the trenches TR, the insulating material layers 500 are patterned to form the insulating layers 302, and the sacrificial layers 502 are patterned to form sacrificial patterns 502a. According to some embodiments, the etching stop layer 304 is functioned as a stop layer during an etching process for forming the trenches TR. In these embodiments, the trenches TR are formed to a top surface of the etching stop layer 304.

Figure 5C:
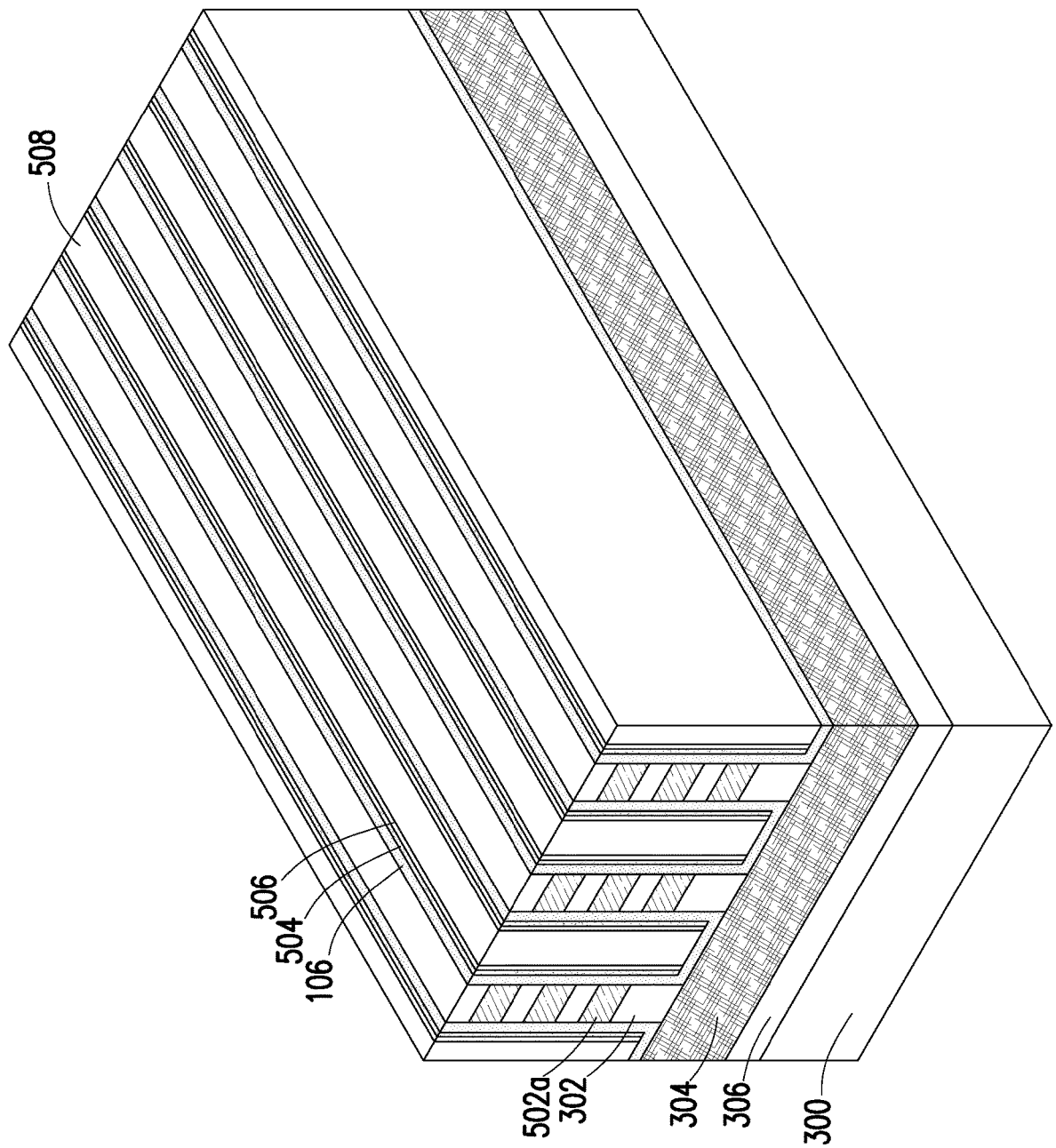

Referring to FIG. 4 and FIG. 5C, at a step S404, the ferroelectric layers 106, channel material layers 504, dielectric material layers 506 and a dielectric material 508 are formed in the trenches TR. Sidewalls of the trenches TR are covered by the ferroelectric layers 106, the channel material layers 504 and the dielectric layers 506 in order. According to some embodiments, the ferroelectric layers 106 may further cover portions of the etching stop layer 304 between the stacks of the insulating layers 302 and the sacrificial patterns 502a. Further, the dielectric material 508 may fill up remained space of the trenches TR. In following steps, the channel material layers 504 will be patterned to form the channel layers 104 as shown in FIG. 3, and the dielectric material layer 506 will be patterned to form the dielectric layers 110 as shown in FIG. 3. In addition, some portions of the dielectric material 508 will be removed, and remained portions of the dielectric material 508 form the dielectric material 114 as shown in FIG. 3. According to some embodiments, deposition processes are performed for forming material layers to be patterned to form the ferroelectric layers 106, the channel material layers 504, the dielectric material layers 506 and the dielectric material 508, and an etching process, a polishing process or a combination thereof may be involved for such patterning.

According to some embodiments, a plurality of the adhesive layers 116 (as shown in FIG. 1A and FIG. 2) are formed along the sidewalls of the trenches TR before formation of the ferroelectric layers 106, such that each sacrificial layer 502 can be in lateral contact with one of the ferroelectric layer 106 through one of the adhesive layers 116, at each side.

Figure 5D:
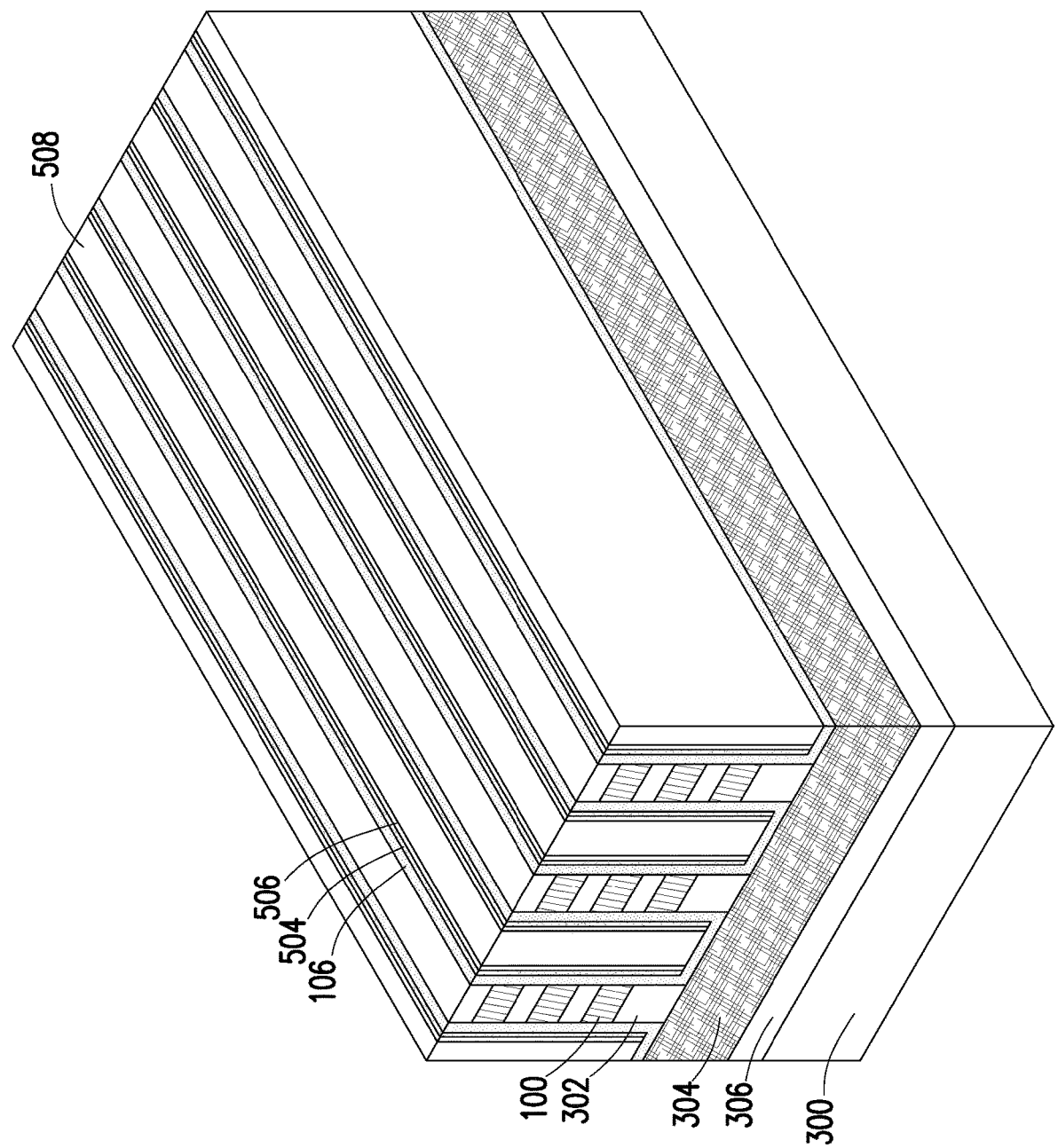

Referring to FIG. 4 and FIG. 5D, at a step S406, the sacrificial patterns 502a are replaced by the gate electrodes 100. An etching process, such as an isotropic etching process, is involved for removing the sacrificial patterns 502a, and a plating process may be involved for forming the gate electrodes 100. During the etching process, the ferroelectric layers 106, the channel material layers 504, the dielectric layers 506 and the dielectric material 508 filled in the trenches TR may provide support for the insulating layers 302, and prevent the insulating layers 302 from collapse.

Figure 5E:
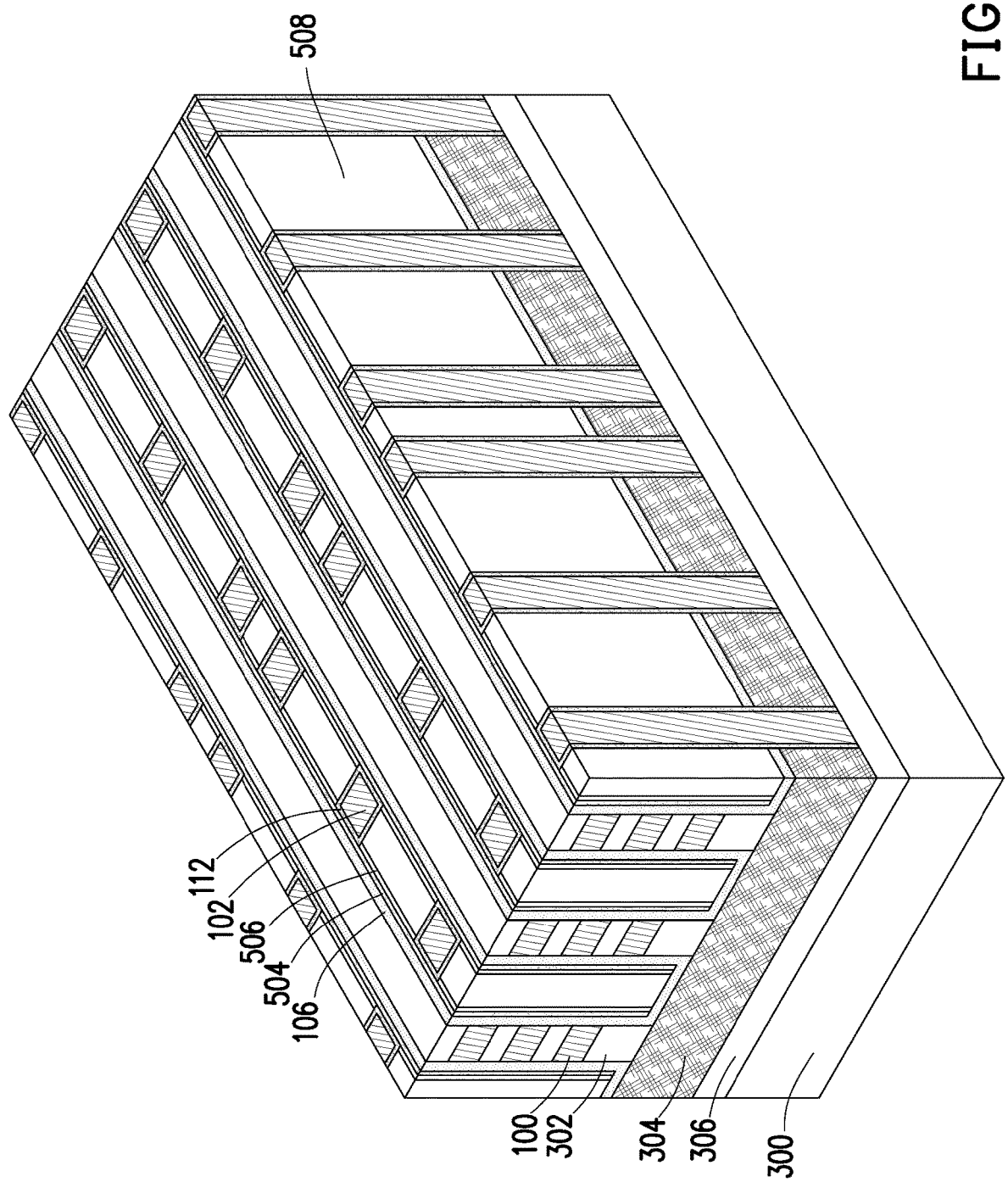

Referring to FIG. 4 and FIG. 5E, at a step S408, the source/drain electrodes 102 are formed through the dielectric material 508, the etching stop layer 304 and the bottom insulating layer 306. In some embodiments, a method for forming the source/drain electrodes 102 includes forming first through holes extending through the dielectric material 508, the etching stop layer 304 and the bottom insulating layer 306, and includes filling a conductive material into these through holes. A planarization process including a polishing process, an etching process or a combination thereof may be used for removing excess portions of the conductive material above the stacks of the gate electrodes 100 and the insulating layers 302, and remained portions of the conductive material in the first through holes form the source/drain electrodes 102. During formation of the first through holes, portions of the dielectric material layers 506 may be removed, such that the source/drain electrodes 102 can be in contact with the channel material layers 504 without the dielectric material layers 506 in between. According to some embodiments, the contact enhancement layers 112 are formed along sidewalls of the first through holes before filling the conductive material for forming the source/drain electrodes 102, such that the later formed source/drain electrodes 102 are each wrapped around by one of the contact enhancement layers 112.

Figure 5F:
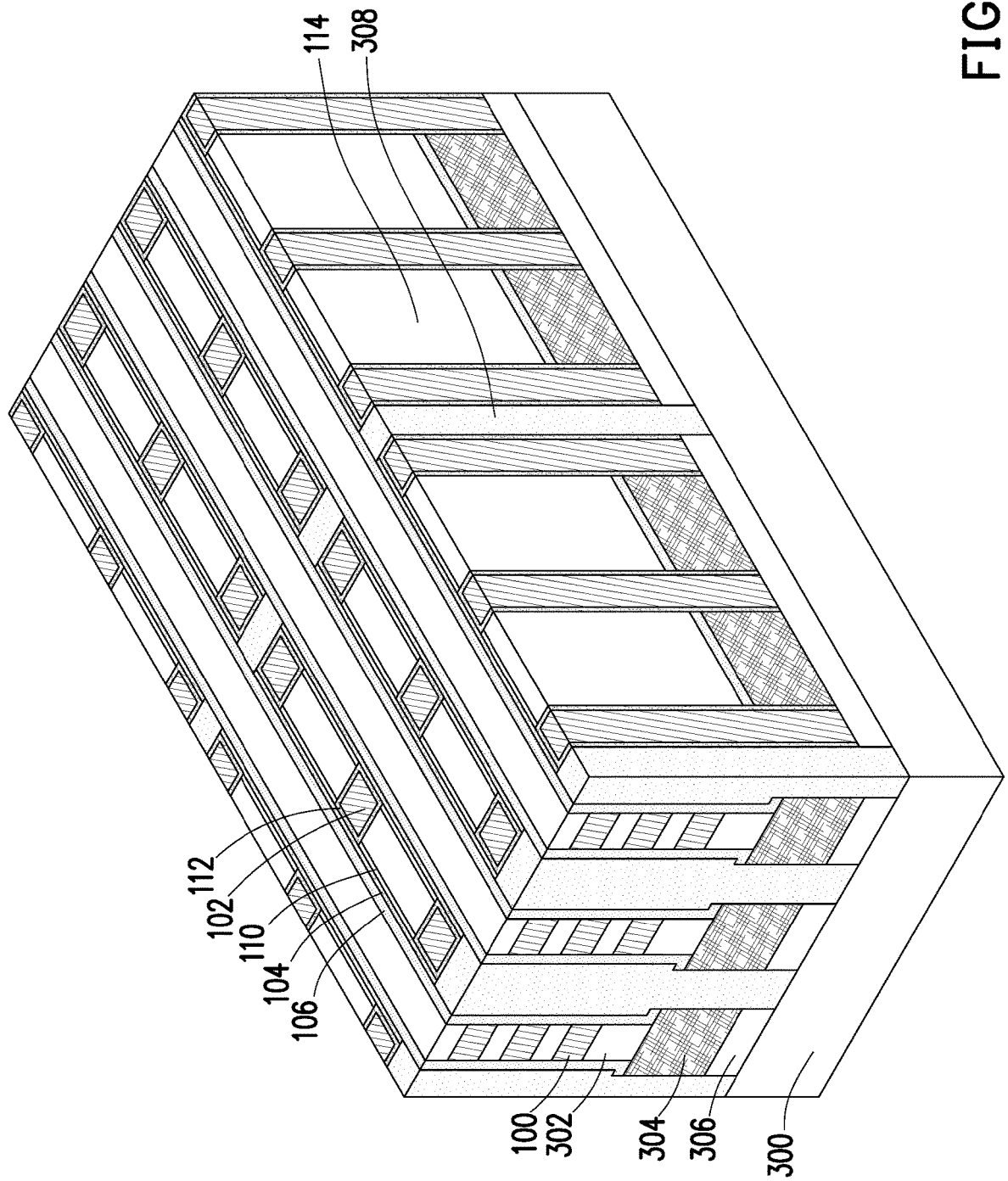

Referring to FIG. 4 and FIG. 5F, at a step S410, the insulating pillars 308 are formed through the dielectric material 508, the etching stop layer 304 and the bottom insulating layer 306. A method for forming the insulating pillars 308 may include forming second through holes extending through the dielectric material 508, the etching stop layer 304 and the bottom insulating layer 306, and include filling an insulating material into the second through holes. During formation of the second through holes, the dielectric material 508 are partially removed, and remained portions of the dielectric material 508 form the dielectric material 114. Further, while forming the second through holes, the channel material layers 504 are patterned to be the channel layers 104 separated from one another. Similarly, the dielectric material layers 506 are cut into the dielectric layers 110 separated from each other while forming the second through holes.

Referring to FIG. 4 and FIG. 3, at a step S412, the auxiliary gates 108 are formed through the dielectric material 508. Formation of the auxiliary gates 108 may include forming third through holes extending to a top surface of the bottom insulating layer 306 through the dielectric material 508 and the etching stop layer 304, and include filling a conductive material into the third through holes. Formation of the third through holes involves removing portions of the dielectric material 508, and remained portions of the dielectric material 508 form the dielectric material 114 as shown in FIG. 3. After performing a possible planarization process (a polishing process, an etching process or a combination thereof) for removing excess portions of the conductive material above the stacks of the gate electrodes 100 and the insulating layers 302, remained portions of the conductive material in the third through holes form the auxiliary gates 108.

It should be noted that, although the steps S408, S410, S412 are described as being performed in order, the steps S408, S410, S412 may be performed by following any of other sequences. That is, the process described with reference to FIG. 4, FIG. 5A through FIG. 5F and FIG. 3 is not limited to a certain sequence of the steps S408, S410, S412.

So far, the memory array 30 as shown in FIG. 3 has been formed. Although not shown, further BEOL process may be performed on the current structure, so as to provide further routings for the memory array 30. For instance, additional conductive features may be further formed for routing the gate electrodes 100 of the memory array 30.

Figure 6A:
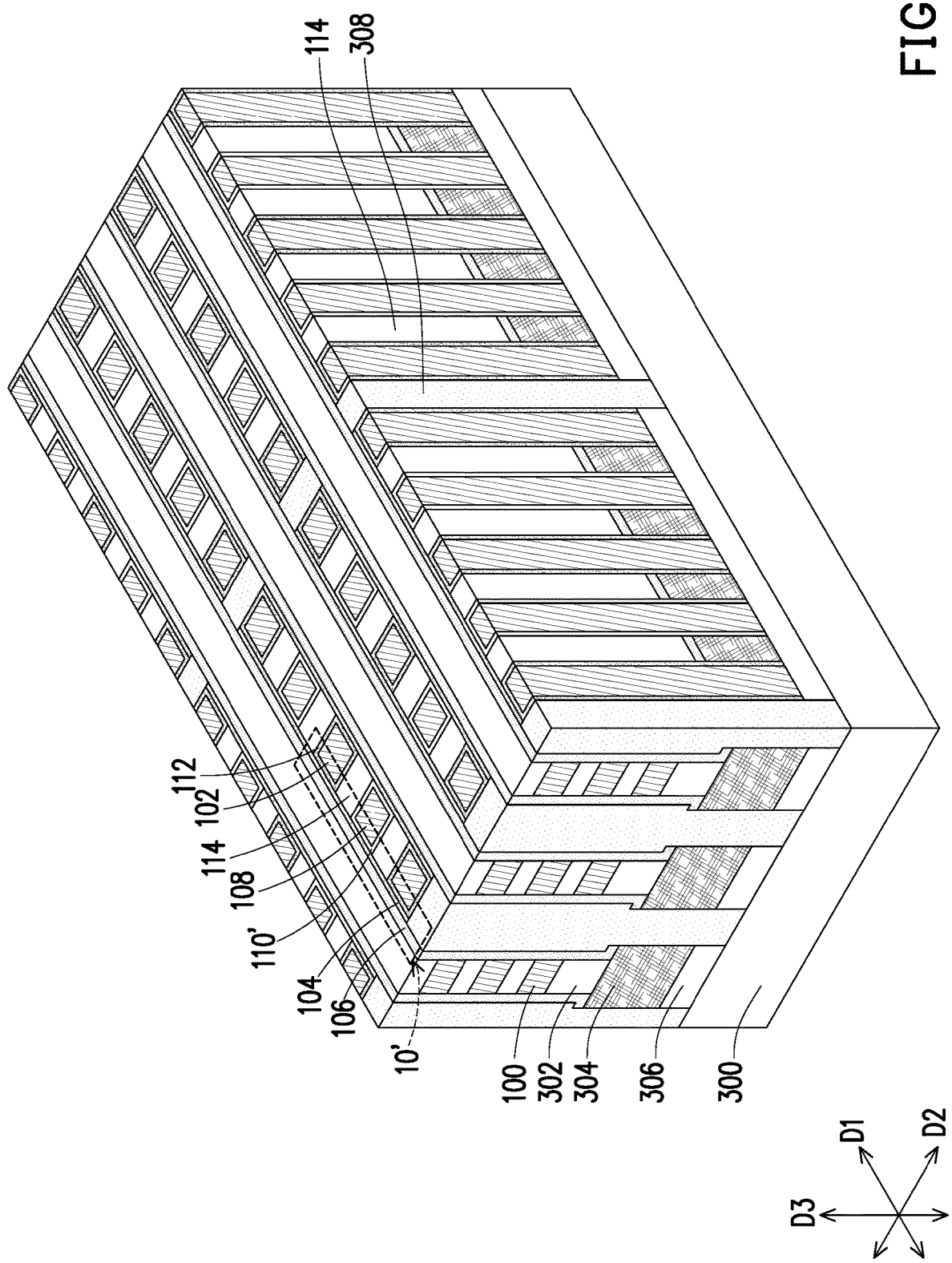
FIG. 6A is a schematic three-dimensional view illustrating a memory array, according to some embodiments of the present disclosure.
Figure 6B:
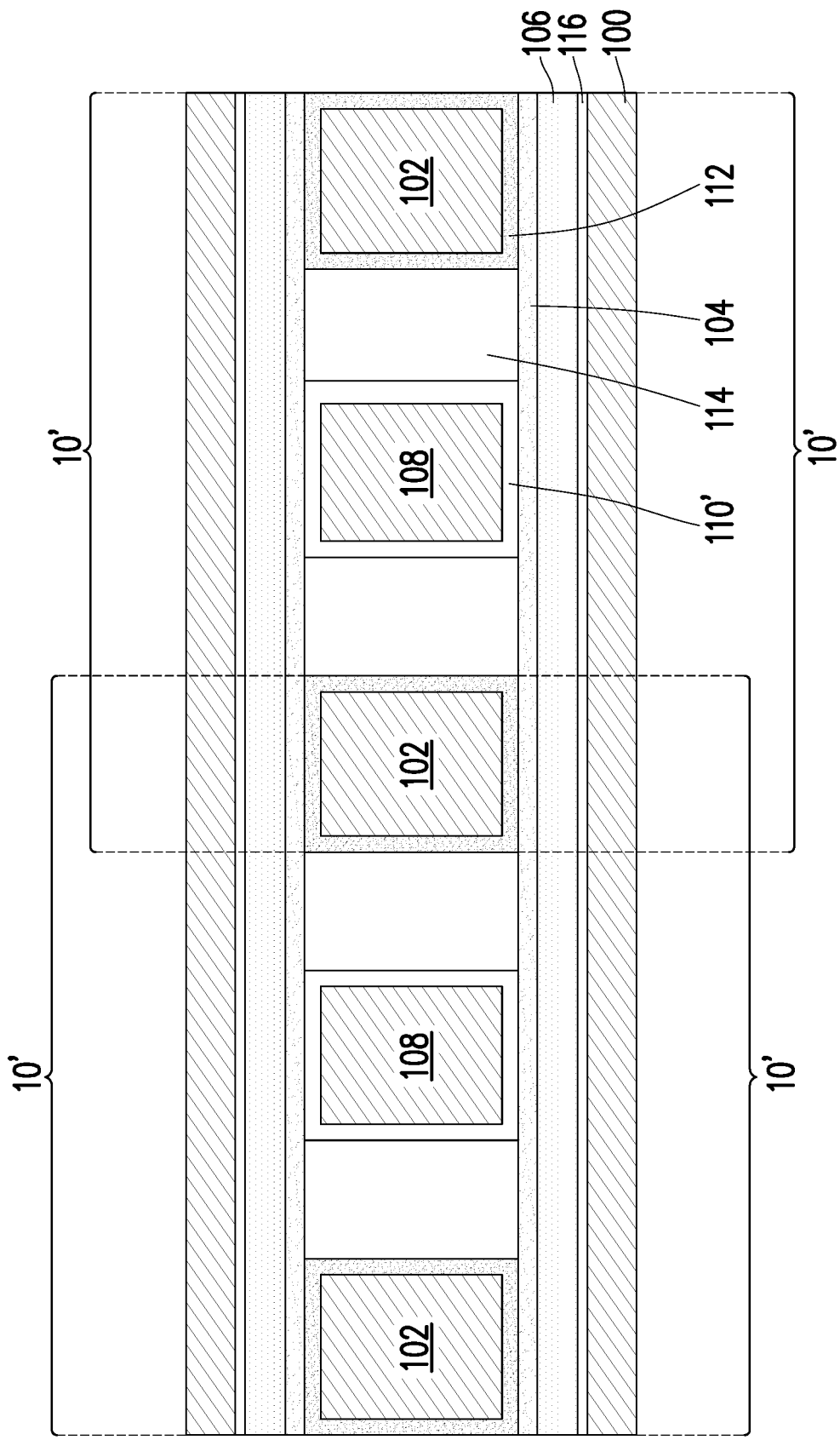
FIG. 6B is a schematic plan view illustrating adjacent ferroelectric memory devices at the same height in the memory array as shown in FIG. 6A.

FIG. 6A is a schematic three-dimensional view illustrating a memory array 60, according to some embodiments of the present disclosure. FIG. 6B is a schematic plan view illustrating adjacent ferroelectric memory devices 10' at the same height in the memory array 60 as shown in FIG. 6A.

The memory array 60 is similar to the memory array 30 as described with reference to FIG. 3, except that the auxiliary gate 108 is capacitively coupled to the channel layer 104 through a surrounding dielectric layer 110' in each of the ferroelectric memory devices 10' in the memory array 60, rather than being separated from the channel layer 104 via the dielectric layer 110 extending along the channel layer 104 (shown in FIG. 3). According to the embodiments shown in FIG. 6A and FIG. 6B, each auxiliary gate 108 is wrapped around by one of the dielectric layers 110', and is in contact with the channel layers 104 at opposite sides through the same dielectric layer 110'. As shown in FIG. 6A, the dielectric layers 110' may extend through the dielectric material 114 and the etching stop layer 304, to a top surface of the etching stop layer 304.

Figure 7:
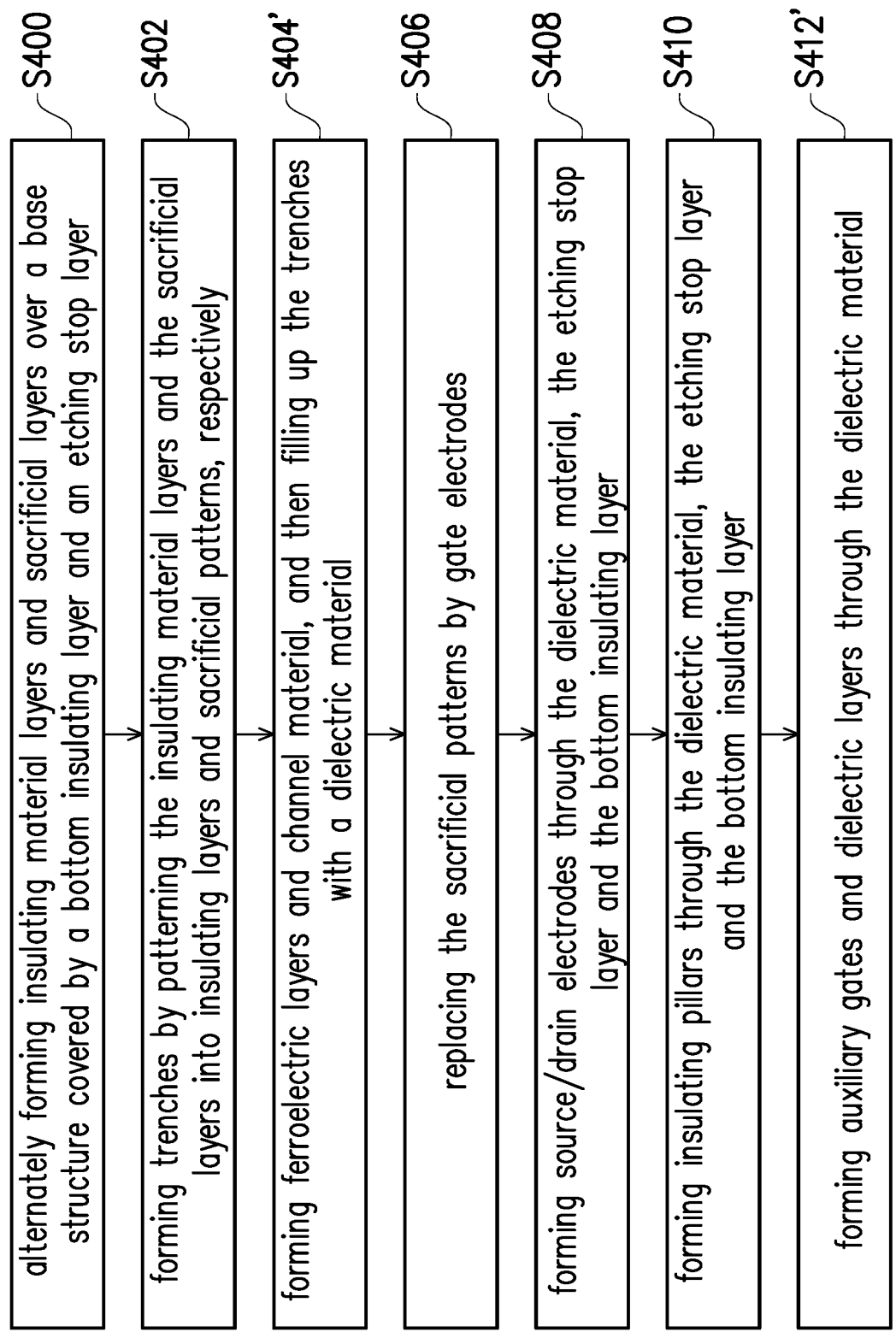
FIG. 7 is a flow diagram illustrating a process for forming the memory array as shown in FIG. 6A, according to some embodiments of the present disclosure.
Figure 8A:
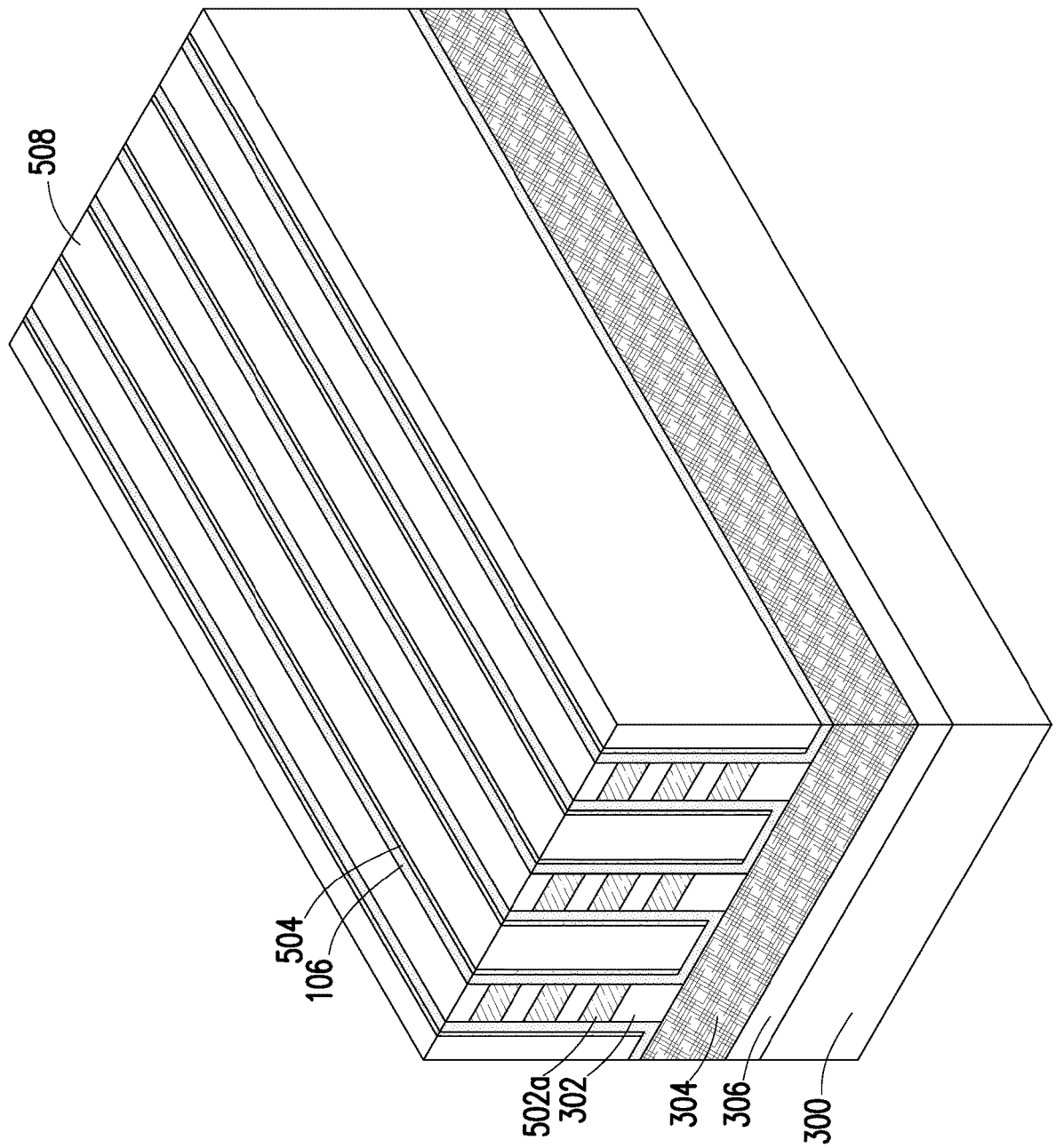
FIG. 8A through FIG. 8C are schematic three-dimensional views illustrating intermediate structures at various stages during the process as shown in FIG. 7.
Figure 8B:
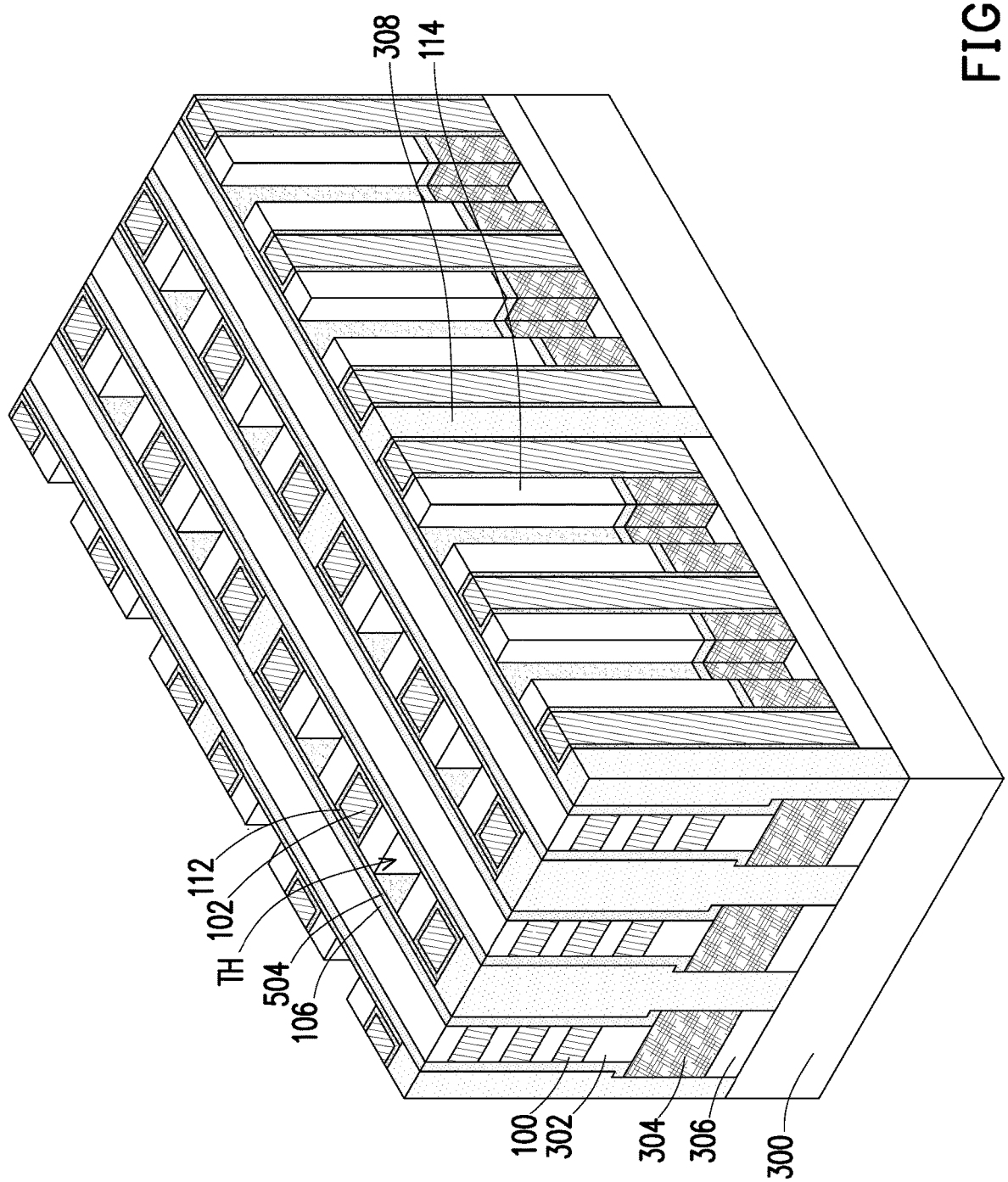
Figure 8C:
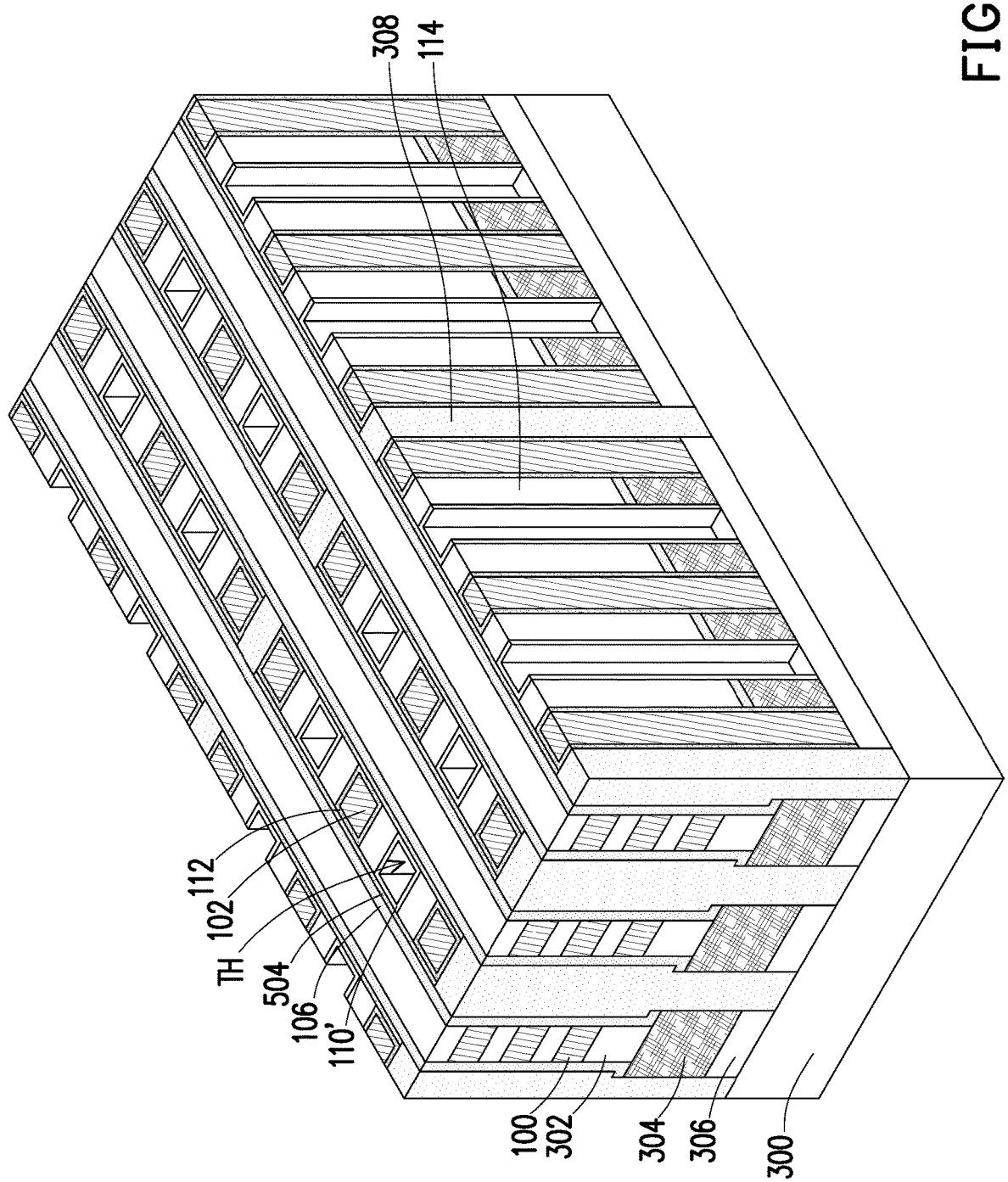

FIG. 7 is a flow diagram illustrating a process for forming the memory array 60, according to some embodiments of the present disclosure. FIG. 8A through FIG. 8C are schematic three-dimensional views illustrating intermediate structures at various stages during the process as shown in FIG. 7.

As similar to the process for forming the memory array 30 as described with reference to FIG. 4, FIG. 5A through FIG. 5F and FIG. 3, the process for forming the memory array 60 may begin with the steps S400, S402, to form the trenches TR in an initial stacking structure. Subsequently, at a step S404' shown in FIG. 8A, the ferroelectric layers 106, the channel material layers 504, and the dielectric material 508 are formed in the trenches TR. Sidewalls of the trenches TR are covered by the ferroelectric layers 106 and the channel material layers 504 in order, and the dielectric material 508 may fill up remained space of the trenches TR. According to some embodiments, the ferroelectric layers 106 further extend along bottom surfaces of the dielectric material 508. As a difference from the step S404 as shown in FIG. 5C, the channel material layers 504 and the dielectric material 508 in the current step are in lateral contact without dielectric material layers in between. Deposition processes are performed for forming material layers to be patterned to form the ferroelectric layers 106, the channel material layers 504 and the dielectric material 508, and an etching process, a polishing process or a combination thereof may be involved for such patterning.

Afterwards, the step S406 for gate replacement, the step S408 for forming the source/drain electrodes 102 and the step S410 for forming the insulating pillars 308 are performed. In addition, at a step S412', the auxiliary gates 108 and the dielectric layers 110' are formed through the dielectric material 508. As shown in FIG. 8B, formation of the auxiliary gates 108 and the dielectric layers 110' may include forming through holes TH extending to a top surface of the bottom insulating layer 306 through the dielectric material 508 and the etching stop layer 304. Formation of the through holes involves removing portions of the dielectric material 508, and remained portions of the dielectric material 508 form the dielectric material 114 as shown in FIG. 6A. Subsequently, as shown in FIG. 8C, the dielectric layers 110' are formed along sidewalls of the through holes TH. A method for forming the dielectric layers 110' may include forming a conformal dielectric layer globally covering the structure as shown in FIG. 8B, and removing portions of the conformal dielectric layer along bottom surfaces of the through holes TH and portions of the conformal dielectric layer outside the through holes TH by a possible etching process. Remained portions of the conformal dielectric layer may form the dielectric layers 110'. Thereafter, as shown in FIG. 6A, the through holes TH are filled up by the auxiliary gates 108. A conductive material may be provided into the through holes TH covered with the dielectric layers 110', and a possible planarization process (polishing process, an etching process or a combination thereof) may be performed for removing portions of the conductive material outside the through holes TH, such that remained portions of the conductive material form the auxiliary gates 108.

Up to here, the memory array 60 has been formed. As similar to the process for forming the memory array 30 as shown in FIG. 3, the process for forming the memory array 60 is not limited to a certain sequence of the steps S408, S410, S412. Furthermore, additional BEOL process may be performed on the memory array 60, and additional conductive features may be formed to provide further routings for the memory array 60.

In addition to having high storage density, each of the memory arrays 30, 60 can further be integrated with other integrated circuits in a semiconductor chip.

Figure 9:
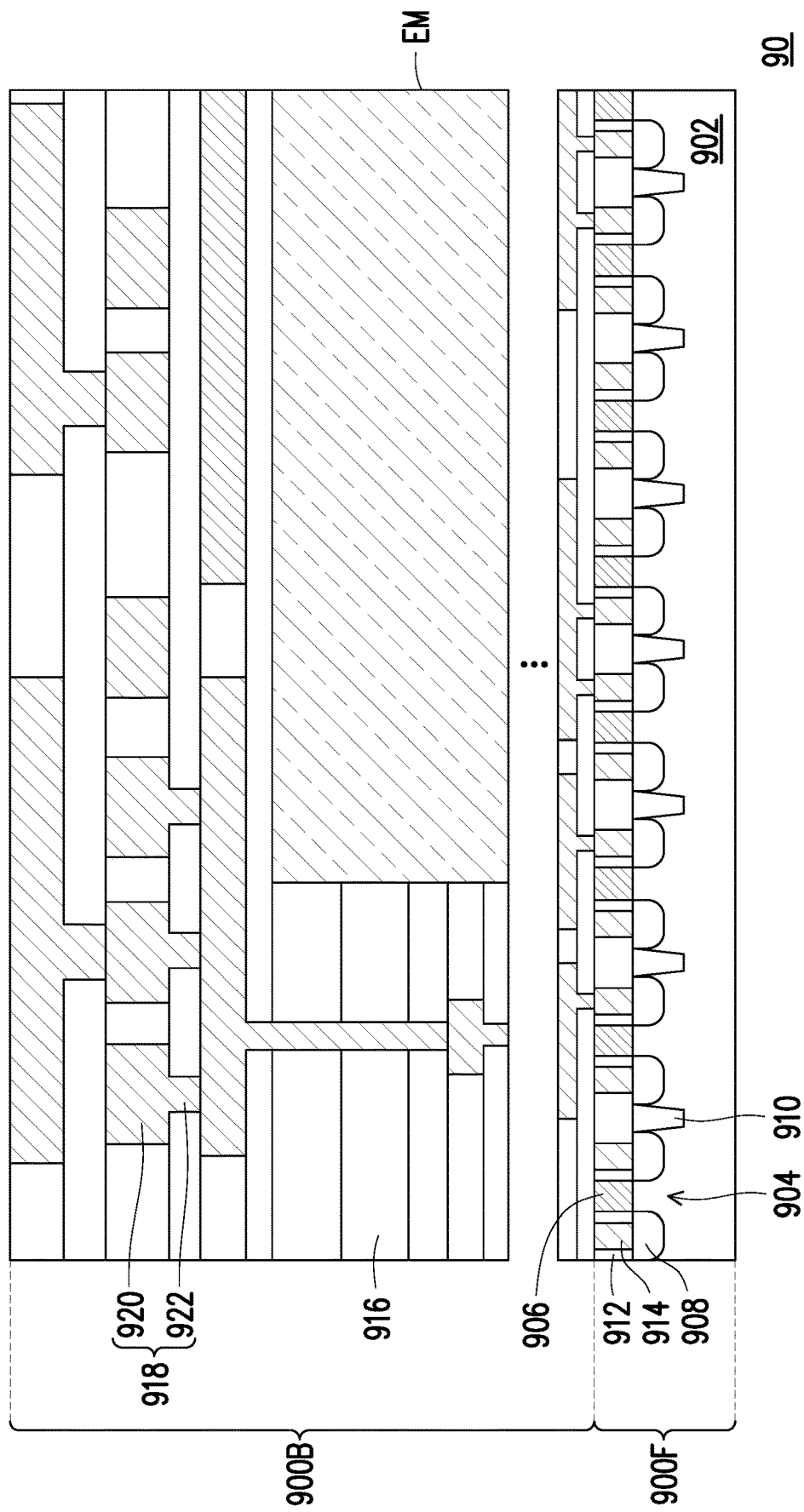
FIG. 9 is a schematic cross-sectional view illustrating a semiconductor chip, according to some embodiments of the present disclosure.

FIG. 9 is a schematic cross-sectional view illustrating a semiconductor chip 90, according to some embodiments of the present disclosure.

Referring to FIG. 9, the semiconductor chip 900 has a front-end-of-line (FEOL) structure 900F built on a semiconductor substrate 902, and includes a back-end-of-line (BEOL) structure 900B disposed on the FEOL structure 900F. An embedded memory EM, which can be any of the memory arrays described above, is integrated in the BEOL structure 900B.

The FEOL structure 900F may include transistors (or referred to as front-end transistors) 904. The transistors 904 may be interconnected to perform various logic functions, and/or to drive the embedded memory EM. Each of the transistors 904 may include a gate structure 906 and a pair of source/drain structures 908 at opposite sides of the gate structure 906. Further, adjacent transistors 904 may be isolated from one another by an isolation structure 910 formed in the semiconductor substrate 902. In some embodiments, the transistors 904 are planar type transistors. In these embodiments, the gate structures 906 are formed on planar portions of the semiconductor substrate 902, and the source/drain structures 908 may be formed in the semiconductor substrate 902. In alternative embodiments, the transistors 904 are fin type transistors or gate-all-around (GAA) transistors. In these alternative embodiments, the semiconductor substrate 902 may be shaped to form fin structures at its top surface, or stacks of channel structures (e.g., stacks of semiconductor nanosheets) may be formed on the semiconductor substrate 902. Each fin structure/channel structure may extend between a pair of the source/drain structures 908. In addition, the gate structures 906 may intersect and cover the fin structures or the stacks of channel structures. Moreover, the FEOL structure 900F may further include a dielectric layer 912 and contact structures 914 formed in the dielectric layer 912. The contact structures 914 penetrate through the dielectric layer 912, to establish electrical contact with the source/drain structures 908.

The BEOL structure 900B may include a stack of interlayer dielectric layers 916. For conciseness, only one of the interlayer dielectric layers 916 is labeled. The embedded memory EM is formed in successive ones of the interlayer dielectric layers 916. Further, the BEOL structure 900B also includes conductive elements 918 spreading in the stack of interlayer dielectric layers 916, for interconnecting the transistors 904, and for out-routing the embedded memory EM. The conductive elements 918 may be distributed below, around and over the embedded memory EM, and may include conductive patterns 920 and conductive vias 922. Each conductive pattern 920 laterally extends in one of the interlayer dielectric layers 916. In addition, each conductive via 922 vertically extends through one or more of the interlayer dielectric layers 916 to establish electrical contact with one or more of the conductive patterns 920, or to establish electrical contact with the embedded memory EM. The embedded memory array EM may be routed to some of the transistors 904 in the FEOL structure 900F through some of the conductive elements 918, and can be driven by a driving circuit including these transistors 904.

Although not shown, passivation layer(s) and electrical connectors as chip inputs/outputs (I/Os) may be formed on the BEOL structure 900B.

As above, a ferroelectric memory device, an operation method of the ferroelectric memory device, a memory array including a plurality of the ferroelectric memory devices, a method for manufacturing the memory array and a semiconductor chip embedded with the memory array are provided. The ferroelectric memory device is a ferroelectric field effect transistor including a ferroelectric layer lying between a gate electrode and a channel layer, and further including an auxiliary gate capacitively coupled to the channel layer at a side of the channel layer facing away from the ferroelectric layer and the gate electrode. As the channel layer is either N-type or P-type, the channel layer can only provide accumulation of negative charge carriers or positive charge carriers at a side of the ferroelectric layer facing away from the gate electrode. In order to properly switch the ferroelectric layer between a first polarization state and a second polarization state for storing binary data, the auxiliary gate can be operated to induce positive charges at a side of the ferroelectric layer facing away from the gate electrode when the channel layer only has the negative charge carriers, and to induce negative charges at such side of the ferroelectric layer when the channel layer only has the positive charge carriers. That is, the ferroelectric memory device can be ensured to have a sufficient memory window with the help provided by the auxiliary gate. Accordingly, a large voltage difference between the gate electrode and source/drain electrodes is no longer required to ensure a sufficient memory window, and a plurality of the ferroelectric memory devices can be arranged with a common source line architecture for increasing storage density, while interference between each pair of the ferroelectric memory devices sharing the same source/drain electrode can be effectively prevented. In some embodiments, the ferroelectric memory devices are stacked along a height direction, and is no longer limited to two-dimensional design. Furthermore, on top of ensuring sufficient memory window and compatibility with a common source line architecture, the auxiliary gate can be further operated for tuning a read voltage providing to the gate electrode during a read operation.

In an aspect of the present disclosure, a memory array is provided. The memory array comprises: a first ferroelectric memory device and a second ferroelectric memory device, formed along a gate electrode, a channel layer and a ferroelectric layer extending between the gate electrode and the channel layer, and comprising: a common source/drain electrode and two respective source/drain electrodes, separately in contact with the channel layer from a back side of the channel layer facing away from the ferroelectric layer and the gate electrode, wherein the common source/drain electrode is disposed between the two respective source/drain electrodes; and a first auxiliary gate and a second auxiliary gate, capacitively coupled to the channel layer from the back side of the channel layer, wherein the first auxiliary gate is located between the common source/drain electrode and one of the two respective source/drain electrodes, and the second auxiliary gate is located between the common source/drain electrode and the other of the two respective source/drain electrodes.

In another aspect of the present disclosure, a method for operating a memory array is provided. The memory array comprises pairs of ferroelectric memory devices formed along a gate electrode, a ferroelectric layer and channel layers separately in lateral contact with the gate electrode through the ferroelectric layer, source/drain electrodes and auxiliary gates of the ferroelectric memory devices are in lateral contact with the channel layers, each of the auxiliary gates is arranged between two of the source/drain electrodes, and the ferroelectric memory devices of each pair share one of the source/drain electrodes. The method comprises: performing a programming operation, such that all of the ferroelectric memory devices are written with a first polarization state, wherein the gate electrode receives a first gate voltage and the source/drain electrodes as well as the auxiliary gates receive a reference voltage during the programming operation; and performing an erase operation following the programming operation, such that at least one of the ferroelectric memory devices is selected to be rewritten with a second polarization state, wherein the gate electrode receives a second gate voltage during the erase operation, and the auxiliary gate and the source/drain electrodes of the at least one of the ferroelectric memory devices receive a third gate voltage and the reference voltage during the erase operation, respectively.

In yet another aspect of the present disclosure, a memory array is provided. The memory array comprises: insulating layers and gate electrodes, alternately stacked over a base structure; a ferroelectric layer, covering a sidewall of a stacking structure comprising the insulating layers and the gate electrodes; channel layers, in lateral contact with the stacking structure through the ferroelectric layer, and are laterally separated from one another; source/drain electrodes, standing on the base structure and in lateral contact with the channel layers, wherein each of the channel layers is in contact with three of the source/drain electrodes; and auxiliary gates, standing between the source/drain electrodes on the base structure, wherein each of the channel layers is in contact with two of the auxiliary gates.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory array, comprising:
a first ferroelectric memory device and a second ferroelectric memory device, formed along a gate electrode, a channel layer and a ferroelectric layer extending between the gate electrode and the channel layer, and comprising:
a common source/drain electrode and two respective source/drain electrodes, separately in contact with the channel layer from a back side of the channel layer facing away from the ferroelectric layer and the gate electrode, wherein the common source/drain electrode is disposed between the two respective source/drain electrodes; and
a first auxiliary gate and a second auxiliary gate, capacitively coupled to the channel layer from the back side of the channel layer, wherein the first auxiliary gate is located between the common source/drain electrode and one of the two respective source/drain electrodes, and the second auxiliary gate is located between the common source/drain electrode and the other of the two respective source/drain electrodes.

2. The memory array according to claim 1, wherein the gate electrode, the ferroelectric layer and the channel layer continuously extend through the first and the second ferroelectric memory devices.

3. The memory array according to claim 1, wherein the common source/drain electrode is shared by the first and second ferroelectric memory devices.

4. The memory array according to claim 1, wherein the first auxiliary gate is separated from the channel layer through a first dielectric layer, and the second auxiliary gate is separated from the channel layer through a second dielectric layer.

5. The memory array according to claim 4, wherein the first and second dielectric layers are laterally separated from each other and located at opposite sides of the common source/drain electrode.

6. The memory array according to claim 4, wherein the first auxiliary gate is wrapped around by the first dielectric layer, and the second auxiliary gate is wrapped around by the second dielectric layer.

7. The memory array according to claim 1, wherein the common source/drain electrode and the two respective source/drain electrodes are in contact with the channel layer through contact enhancement layers, respectively.

8. The memory array according to claim 7, wherein the contact enhancement layers wraps around the common source/drain electrode and the two respective source/drain electrodes, respectively.

9. A method for operating a memory array, wherein the memory array comprises pairs of ferroelectric memory devices formed along a gate electrode, a ferroelectric layer and channel layers separately in lateral contact with the gate electrode through the ferroelectric layer, source/drain electrodes and auxiliary gates of the ferroelectric memory devices are in lateral contact with the channel layers, each of the auxiliary gates is arranged between two of the source/drain electrodes, the ferroelectric memory devices of each pair share one of the source/drain electrodes, and the method comprises:
  performing a programming operation, such that all of the ferroelectric memory devices are written with a first polarization state, wherein the gate electrode receives a first gate voltage and the source/drain electrodes as well as the auxiliary gates receive a reference voltage during the programming operation; and
  performing an erase operation following the programming operation, such that at least one of the ferroelectric memory devices is selected to be rewritten with a second polarization state, wherein the gate electrode receives a second gate voltage during the erase operation, and the auxiliary gate and the source/drain electrodes of the at least one of the ferroelectric memory devices receive a third gate voltage and the reference voltage during the erase operation, respectively.

10. The method for operating the memory array according to claim 9, wherein a voltage difference between the second and third gate voltages is greater than a voltage difference between the second gate voltage and the reference voltage.

11. The method for operating the memory array according to claim 9, wherein a voltage difference between the second and third gate voltages is sufficient for changing a polarization state of the ferroelectric layer, whereas a voltage difference between the second gate voltage and the reference voltage is insufficient for changing a polarization state of the ferroelectric layer.

12. The method for operating the memory array according to claim 9, wherein the second and third gate voltages are provided with identical polarity, but having different amplitudes.

13. The method for operating the memory array according to claim 9, wherein unselected ones of the ferroelectric memory devices is not subjected to the erase operation.

14. A memory array, comprising:
  insulating layers and gate electrodes, alternately stacked over a base structure;
  a ferroelectric layer, covering a sidewall of a stacking structure comprising the insulating layers and the gate electrodes;
  channel layers, in lateral contact with the stacking structure through the ferroelectric layer, and are laterally separated from one another;
  source/drain electrodes, standing on the base structure and in lateral contact with the channel layers, wherein each of the channel layers is in contact with three of the source/drain electrodes; and
  auxiliary gates, standing between the source/drain electrodes on the base structure, wherein each of the channel layers is in contact with two of the auxiliary gates.

15. The memory array according to claim 14, wherein the auxiliary gates are in lateral contact with the channel layers through dielectric layers, respectively.

16. The memory array according to claim 15, wherein each of the dielectric layers extends along one of the channel layers.

17. The memory array according to claim 15, wherein the dielectric layers wrap around the auxiliary gates, respectively.

18. The memory array according to claim 14, further comprising an etching stop layer and a bottom insulating layer lying below the stacking structure, wherein the bottom insulating layer extends between the base structure and the etching stop layer.

19. The memory array according to claim 18, wherein the source/drain electrodes and the auxiliary gates penetrate through the etching stop layer, and are separated from the base structure by the bottom insulating layer.

20. The memory array according to claim 14, further comprising:
  a dielectric material, separating each of the auxiliary gates from adjacent ones of the source/drain electrodes; and
  insulating pillars, standing on the base structure, and separating the channel layers from one another.

* * * * *